US012626771B2

(12) United States Patent
Xie

(10) Patent No.: US 12,626,771 B2
(45) Date of Patent: May 12, 2026

(54) MEMORY DEVICES AND OPERATION METHODS THEREOF, AND MEMORY SYSTEMS

(71) Applicant: YANGTZE MEMORY TECHNOLOGIES CO., LTD., Wuhan (CN)

(72) Inventor: Shu Xie, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 182 days.

(21) Appl. No.: 18/666,520

(22) Filed: May 16, 2024

(65) Prior Publication Data

US 2025/0226037 A1 Jul. 10, 2025

(30) Foreign Application Priority Data

Jan. 8, 2024 (CN) .......................... 202410029469.1

(51) Int. Cl.
*G11C 16/32* (2006.01)
(52) U.S. Cl.
CPC .................................... *G11C 16/32* (2013.01)
(58) Field of Classification Search
CPC ....... G11C 16/32; G11C 16/0483; G11C 7/22; G11C 7/1036; G11C 16/10

USPC ...................................................... 365/185.18
See application file for complete search history.

(56) References Cited

U.S. PATENT DOCUMENTS

| | | | |
|---|---|---|---|
| 2005/0258881 A1* | 11/2005 | Schultz ..................... | G06F 1/10 |
| | | | 327/161 |
| 2019/0122720 A1* | 4/2019 | Tajima ................... | G11C 7/222 |
| 2022/0059148 A1* | 2/2022 | Kim ...................... | G11C 29/028 |
| 2023/0072675 A1* | 3/2023 | Lee ........................ | H03K 5/065 |

* cited by examiner

*Primary Examiner* — Amir Zarabian
(74) *Attorney, Agent, or Firm* — Conley Rose, P.C

(57) ABSTRACT

The present disclosure provides memory devices and operation methods thereof, and memory systems. A peripheral circuit of an example memory device includes: a page buffer including a plurality of partitions, wherein each partition is configured to receive a clock signal and output a return clock signal based on the clock signal; a first branch node connected with two partitions of the plurality of partitions, and configured to combine the return clock signals outputted by the two partitions to generate a first combined clock signal; a first clock path with two ends respectively connected with the first branch node and an input/output node, and configured to transmit the first combined clock signal to the input/output node; a second branch node; and a second clock path.

20 Claims, 13 Drawing Sheets

MEMORY DEVICES AND OPERATION METHODS THEREOF, AND MEMORY SYSTEMS

CROSS-REFERENCE TO RELATED APPLICATIONS

The present application claims priority to Chinese Patent Application No. 2024100294691, which was filed Jan. 8, 2024, is titled "MEMORY DEVICE AND ITS OPERATING METHOD, MEMORY SYSTEM," and is hereby incorporated herein by reference in its entirety.

TECHNICAL FIELD

The present disclosure relates to the technical field of semiconductors, and in particular, to a memory device and an operation method thereof, and a memory system.

BACKGROUND

A memory device is a memory apparatus configured to save information in the modern information technology. As a typical non-volatile semiconductor memory, the Not-And (NAND) flash memory has become a mainstream product in the storage market as it has a relatively-high memory density, controllable production costs, appropriate program and erase speeds, and a retention characteristic.

SUMMARY

In view of this, examples of the present disclosure provide memory devices and operation methods thereof, and memory systems.

In a first aspect, examples of the present disclosure provide a memory device. The memory device comprises a memory array and a peripheral circuit coupled with the memory array; and the peripheral circuit comprises: a page buffer, wherein the page buffer comprises a plurality of partitions, and each partition is configured to receive a clock signal and output a return clock signal based on the clock signal; a first branch node connected with two partitions of the plurality of partitions, and configured to combine return clock signals outputted by the two partitions to generate a first combined clock signal; a first clock path, wherein two ends of the first clock path are respectively connected with the first branch node and an input/output node, and the first clock path is configured to transmit the first combined clock signal to the input/output node; a second branch node connected with other two partitions of the plurality of partitions, and configured to combine return clock signals outputted by the other two partitions to generate a second combined clock signal; and a second clock path, wherein two ends of the second clock path are respectively connected with the second branch node and the input/output node, and the second clock path is configured to transmit the second combined clock signal to the input/output node.

In one optional implementation, the peripheral circuit further comprises: a third branch node, wherein the first clock path and the second clock path both pass through the third branch node; a portion of the first clock path that is located between the third branch node and the input/output node is arranged parallel to a portion of the second clock path that is located between the third branch node and the input/output node; the portion of the first clock path that is located between the third branch node and the input/output node is configured to transmit the first combined clock signal to the input/output node; and the portion of the second clock path that is located between the third branch node and the input/output node is configured to transmit the second combined clock signal to the input/output node.

In one optional implementation, the first branch node is further configured to combine data signals outputted by the two partitions to generate a first combined data signal; the second branch node is further configured to combine data signals outputted by the other two partitions to generate a second combined data signal; and the peripheral circuit further comprises: a first data path, wherein the first data path is arranged parallel to the first clock path and configured to transmit the first combined data signal to the input/output node; and a second data path, wherein the second data path is arranged parallel to the second clock path and configured to transmit the second combined data signal to the input/output node.

In one optional implementation, the input/output node comprises: a first match circuit configured to match the first combined clock signal and the first combined data signal; and a second match circuit configured to match the second combined clock signal and the second combined data signal.

In one optional implementation, the peripheral circuit further comprises: a data temporary storage; a third clock path, wherein two ends of the third clock path are respectively connected with the input/output node and the data temporary storage, and the third clock path is configured to transmit the first combined clock signal to the data temporary storage; a fourth clock path, wherein two ends of the fourth clock path are respectively connected with the input/output node and the data temporary storage, and the fourth clock path is configured to transmit the second combined clock signal to the data temporary storage; a third data path, wherein two ends of the third data path are respectively connected with the input/output node and the data temporary storage, and the third data path is configured to transmit the first combined data signal to the data temporary storage; and a fourth data path, wherein two ends of the fourth data path are respectively connected with the input/output node and the data temporary storage, and the fourth data path is configured to transmit the second combined data signal to the data temporary storage.

In one optional implementation, the data temporary storage comprises a plurality of first temporary storage areas and a plurality of second temporary storage areas; the first temporary storage areas and the second temporary storage areas are alternately arranged; the plurality of first temporary storage areas are configured to receive a first control signal and the first combined clock signal, and receive the first combined data signal based on the first control signal and the first combined clock signal; and the plurality of second temporary storage areas are configured to receive a second control signal and the second combined clock signal, and receive the second combined data signal based on the second control signal and the second combined clock signal.

In one optional implementation, the input/output node is configured to receive a first clock signal; and the peripheral circuit further comprises: a fifth clock path, wherein two ends of the fifth clock path are respectively connected with the input/output node and the third branch node, and the fifth clock path is configured to transmit the first clock signal to the third branch node; the third branch node is configured to generate in parallel a first clock sub-signal and a second clock sub-signal based on the first clock signal; a sixth clock path, wherein two ends of the sixth clock path are respectively connected with the third branch node and the first branch node, and the sixth clock path is configured to transmit the first clock sub-signal to the first branch node; and a seventh clock path, wherein two ends of the seventh clock path are respectively connected with the third branch node and the second branch node, and the seventh clock path is configured to transmit the second clock sub-signal to the second branch node; and a length of the sixth clock path is different from a length of the seventh clock path.

In one optional implementation, the input/output node is configured to receive a first data signal; and the peripheral circuit further comprises: a fifth data path, wherein the fifth data path is arranged parallel to the fifth clock path, and configured to transmit the first data signal to the third branch node; the third branch node is further configured to equally divide the first data signal into a first data sub-signal and a second data sub-signal; a sixth data path, wherein the sixth data path is arranged parallel to the sixth clock path and configured to transmit the first data sub-signal to the first branch node; and a seventh data path, wherein two ends of the seventh data path are respectively connected with the third branch node and the second branch node, and the seventh data path is configured to transmit the second data sub-signal to the second branch node.

In one optional implementation, a bit width of the fifth data path is greater than or equal to twice the bit width of the sixth data path or twice the bit width of the seventh data path.

In one optional implementation, the memory device comprises a pad area and a memory plane area arranged in a first direction, wherein the pad area comprises the input/output node and the third branch node; the memory plane area comprises the page buffer, the first branch node, and the second branch node; the two partitions are symmetrically distributed on two opposite sides of the first branch node in a second direction; the other two partitions are symmetrically distributed on two opposite sides of the second branch node in the second direction; and the second direction is perpendicularly to the first direction.

In one optional implementation, a partition comprises a frequency divider, and the frequency divider is configured to receive the clock signal and generate the return clock signal based on the clock signal.

In one optional implementation, the first branch node and the second branch node both comprise an OR gate; and an OR gate of the first branch node is configured to combine the return clock signals outputted by the two partitions to generate the first combined clock signal, and an OR gate of the second branch node is configured to combine the return clock signals outputted by the other two partitions to generate the second combined clock signal.

In one optional implementation, the memory device comprises a three-dimensional NAND memory.

In a second aspect, examples of the present disclosure provide a memory system, comprising: at least one memory device described in the above-mentioned implementations; and a memory controller coupled with the at least one memory device and configured to control the memory device.

In a third aspect, examples of the present disclosure provide an operation method of a memory device. The operation method comprises: receiving a clock signal and outputting a return clock signal based on the clock signal, by a partition of a page buffer; combining return clock signals outputted by two partitions of a plurality of partitions to generate a first combined clock signal; transmitting the first combined clock signal to an input/output node; combining return clock signals outputted by other two partitions of the plurality of partitions to generate a second combined clock signal; and transmitting the second combined clock signal to the input/output node.

In one optional implementation, the transmitting the first combined clock signal to the input/output node, and the transmitting the second combined clock signal to the input/output node comprise: transmitting in parallel the first combined clock signal and the second combined clock signal to the input/output node.

In one optional implementation, the operation method further comprises: combining data signals outputted by the two partitions to generate a first combined data signal; combining data signals outputted by the other two partitions to generate a second combined data signal; transmitting the first combined data signal to the input/output node; and transmitting the second combined data signal to the input/output node.

In one optional implementation, the operation method further comprises: matching the first combined clock signal and the first combined data signal; and matching the second combined clock signal and the second combined data signal.

In one optional implementation, the operation method further comprises: transmitting the first combined clock signal and the first combined data signal to a data temporary storage from the input/output node; and transmitting the second combined clock signal and the second combined data signal to the data temporary storage from the input/output node.

In one optional implementation, the operation method further comprises: receiving a first control signal and the first combined clock signal and receiving the first combined data signal based on the first control signal and the first combined clock signal, by a plurality of first temporary storage areas of the data temporary storage; and receiving a second control signal and the second combined clock signal and receiving the second combined data signal based on the second control signal and the second combined clock signal, by a plurality of second temporary storage areas of the data temporary storage, wherein the first temporary storage areas and the second temporary storage areas are alternately arranged.

In one optional implementation, before receiving the clock signal by partitions of the page buffer, and outputting the return clock signal based on the clock signal, the method further comprises: receiving a first clock signal; transmitting the first clock signal to the third branch node from the input/output node; generating in parallel a first clock sub-signal and a second clock sub-signal based on the first clock signal; transmitting the first clock sub-signal to a first branch node; and transmitting the second clock sub-signal to a second branch node.

In one optional implementation, the method further comprises: receiving a first data signal; transmitting the first data signal to the third branch node from the input/output node; equally dividing the first data signal into a first data sub-signal and a second data sub-signal; transmitting the first data sub-signal to the first branch node; and transmitting the second data sub-signal to the second branch node.

DETAILED DESCRIPTION

Figure 1:
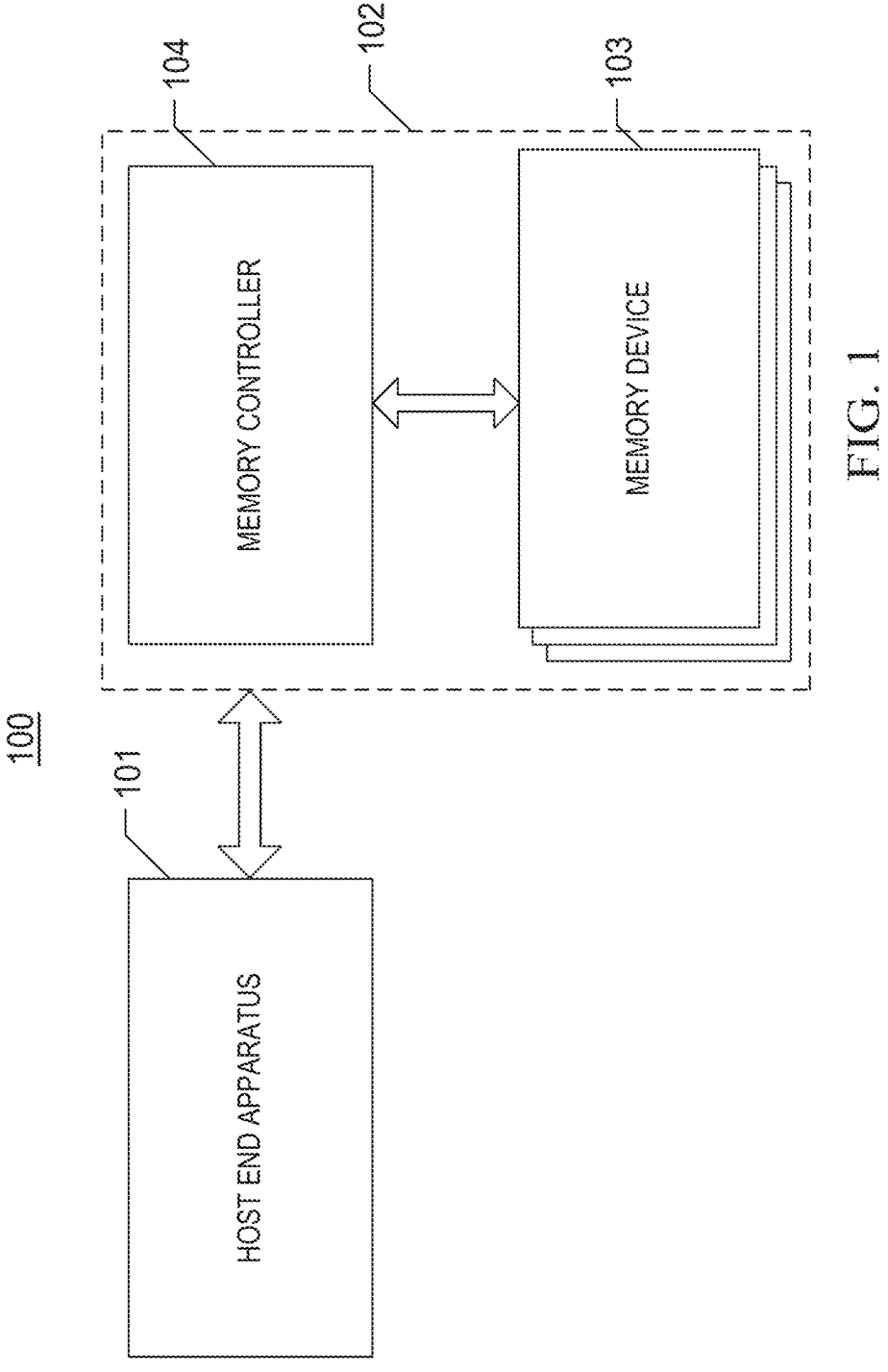
FIG. 1 is a schematic diagram of an example system having a memory system provided by examples of the present disclosure.

Example implementations disclosed in the present disclosure are described in more detail with reference to drawings. Although the example implementations of the present disclosure are shown in the drawings, it should be understood that the present disclosure may be implemented in various forms and should not be limited by the example implementations described here. On the contrary, these implementations are provided for more thorough understanding of the present disclosure, and to fully convey a scope disclosed in the implementations of the present disclosure to a person skilled in the art.

In the following descriptions, a lot of details are given in order to provide the more thorough understanding of the present disclosure. However, it is apparent to a person skilled in the art that the present disclosure may be implemented without one or more of these details. In other examples, in order to avoid confusion with the present disclosure, some technical features well-known in the field are not described. Namely, all the features of the actual implementations are not described here, and well-known functions and structures are not described in detail.

In the accompanying drawings, like reference numerals denote like elements throughout the specification.

It should be understood that, spatially relative terms, such as "beneath", "below", "lower", "under", "over", "upper", etc., may be used herein for ease of description to describe the relationship between one element or feature and other elements or features as illustrated in the figures. It should be understood that, the spatially relative terms are intended to further encompass different orientations of a device in use or operation in addition to the orientation depicted in the figures. For example, if a device in the drawings is turned over, then an element or a feature described as "below other elements", or "under other elements", or "beneath other elements" will be orientated to be "above" the other elements or features. Thus, the example terms, "below" and "beneath", may comprise both upper and lower orientations. The device may be orientated otherwise (rotated by 90 degrees or other orientations), and the spatially descriptive terms used herein are interpreted accordingly.

The terms used herein are only intended to describe the examples, and are not used as limitations of the present disclosure. As used herein, unless otherwise indicated expressly in the context, "a", "an" and "the" in a singular form are also intended to comprise a plural form. It should also be understood that the terms "comprised of" and/or "comprise", when used in this specification, determine the presence of the feature, integer, step, operation, element and/or component, but do not preclude the presence or addition of one or more of other features, integers, steps, operations, elements, components, and/or groups. As used herein, a term "and/or" includes any and all combinations of related items listed.

A memory system in examples of the present disclosure includes, but is not limited to, a memory system comprising a three-dimensional NAND memory. For ease of understanding, the memory system provided by the present disclosure is described by using the memory system comprising the three-dimensional NAND memory as an example.

FIG. 1 is a schematic diagram of an example system having a memory system provided by examples of the present disclosure. In examples of the present disclosure, the system 100 may comprise a mobile phone, a desktop computer, a laptop computer, a tablet computer, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatus having a memory. As shown in FIG. 1, the system 100 may comprise a host end apparatus 101 and a memory system 102, and the memory system 102 may comprise one or more memory devices 103 and a memory controller 104. The host end apparatus 101 may be a processor of an electronic apparatus, such as a Central Processing Unit (CPU), or a System on Chip (SoC), such as an Application Processor (AP). The host end apparatus 101 may be configured to send or receive data to or from the memory system 102.

In some implementations, the memory controller 104 is coupled to the memory device 103 and the host end apparatus 101, and is configured to control the memory device 103. The memory controller 104 may manage data stored in the memory device 103, and communicate with the host end apparatus 101. In some implementations, the memory controller 104 is designed for operating in a low duty-cycle environment, such as secure digital cards, Compact Flash Cards (CFC), Universal Serial Bus (USB) flash drives, or other media for use in electronic apparatuses, such as personal computers, digital cameras, mobile phones, etc. In some other implementations, the memory controller 104 is designed for operating in a high duty-cycle environment, such as solid state drives or Embedded Multi-Media Cards (eMMC).

In some examples, the memory controller 104 and the one or more memory devices 103 may be integrated in various types of memory apparatuses, that is to say, the memory system 102 may be implemented and packaged into different types of end electronic products.

Figure 3:
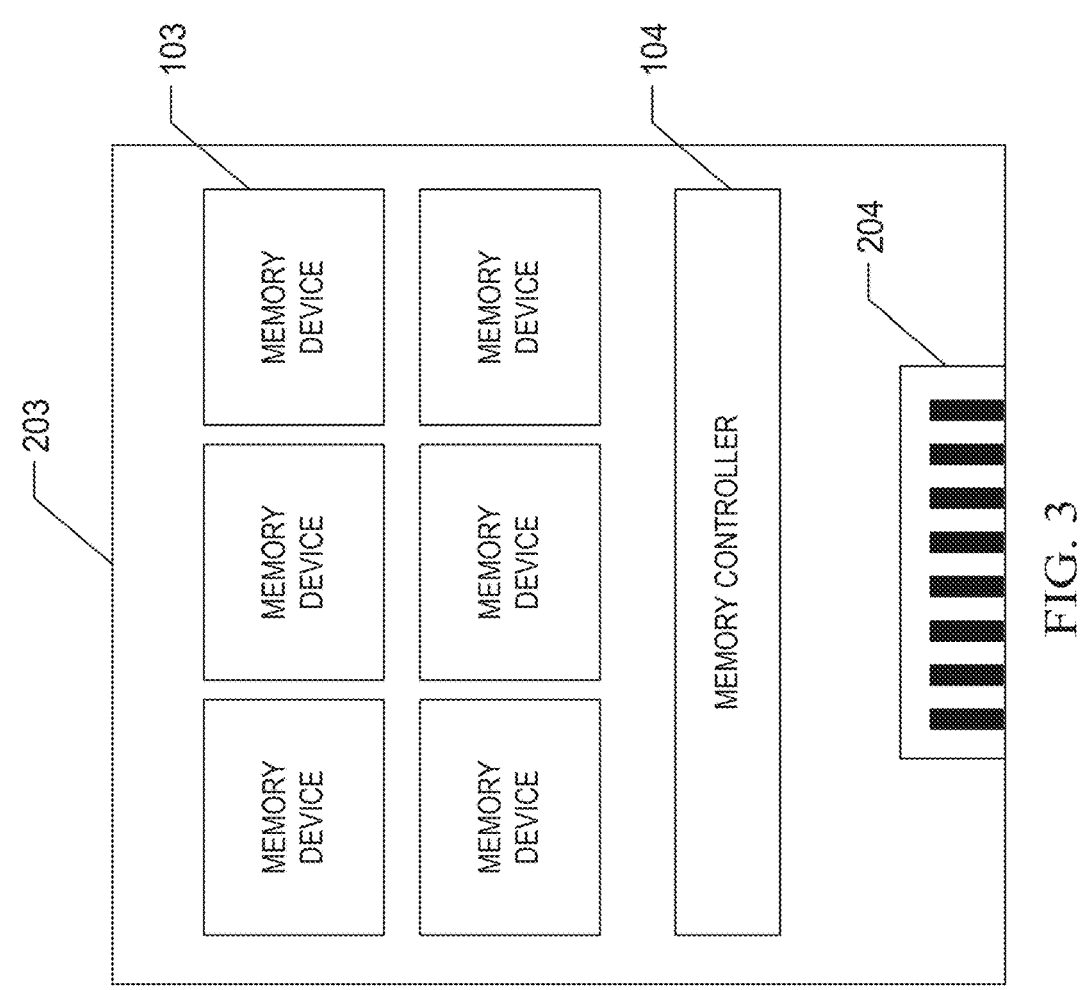
FIG. 3 is a schematic diagram of an example solid state drive having a memory system provided by examples of the present disclosure.
Figure 2:
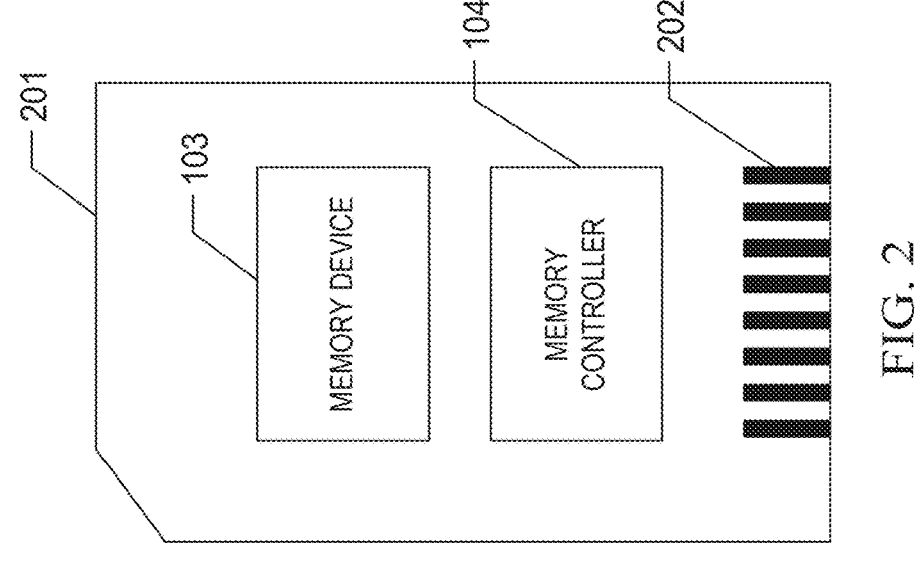
FIG. 2 is a schematic diagram of an example memory card having a memory system provided by examples of the present disclosure.

In an example shown in FIG. 2, the memory controller 104 and the single memory device 103 may be integrated into a memory card 201. The memory card 201 may be one of a compact flash card, a Smart Media Card (SMC), a Memory Stick (MS), a Multi-Media Card (MMC) such as RS-MMC, MMCmicro, eMMC, etc., a secure digital card such as a Mini SD card, a Micro SD card, an SDHC card, etc., or a universal flash card. The memory card 201 may further comprise a memory card connector 202 coupling the memory card 201 with the host end apparatus (e.g., the host end apparatus 101 in FIG. 1). In another example shown in FIG. 3, the memory controller 104 and the plurality of memory devices 103 may be integrated into an SSD 203. The SSD 203 may further comprise an SSD connector 204 coupling the SSD 203 with the host end apparatus (e.g., the host end apparatus 101 in FIG. 1). In some implementations, a storage capacity and/or operation speed of the SSD 203 is greater than a storage capacity and/or operation speed of the memory card 201.

Figure 4:
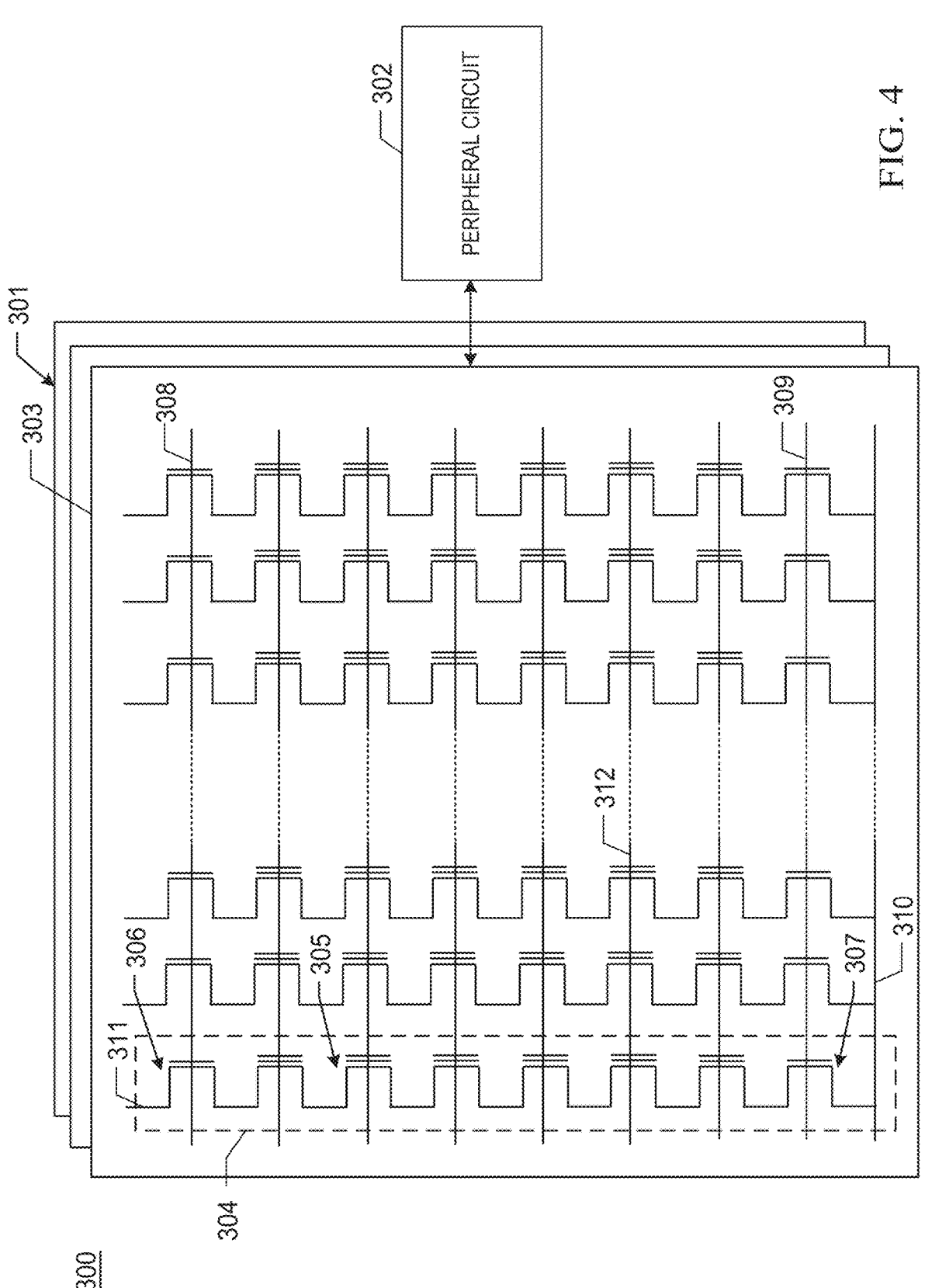
FIG. 4 is a schematic diagram of an example memory device comprising a peripheral circuit provided by examples of the present disclosure.

FIG. 4 is a schematic circuit diagram of an example memory device 300 comprising a peripheral circuit provided by examples of the present disclosure. The memory device 300 may be an example of the memory device 103 in FIG. 1. The memory device 300 may comprise a memory array 301 and a peripheral circuit 302 coupled to the memory array 301. For example, the memory array 301 is a three-dimensional NAND memory array, wherein a memory cell 305 is a NAND memory cell; the memory cell 305 is provided in the form of an array of memory strings 304; and each memory string 304 perpendicularly extends above a substrate (not shown). In some implementations, each memory string 304 comprises a plurality of memory cells 305 coupled in series and stacked perpendicularly. Each memory cell 305 may maintain a continuous analog value, such as voltage or charge, which depends on the number of electrons trapped within a region of the memory cells 305. Each memory cell 305 may be either a floating gate type memory cell that comprises a floating gate transistor, or a charge trapping type memory cell that comprises a charge trapping transistor.

In some implementations, each memory cell 305 is a Single Level Cell (SLC) that has two possible memory states and thus may store one bit of data. For example, a first memory state "O" may correspond to a first voltage range, and a second memory state "1" may correspond to a second voltage range. In some implementations, each memory cell 305 is a multi-level cell that can store more than a single bit of data in four or more than four memory states, for example, a Multi-Level Cell (MLC) storing two bits per unit, a Triple Level Cell (TLC) storing three bits per unit, or a Quad-Level Cell (QLC) storing four bits per unit.

As shown in FIG. 4, each memory string 304 may comprise a Bottom Select Transistor (BST) 307 at its source end and a Top Select Transistor (TST) 306 at its drain end. The bottom select transistor 307 and the top select transistor 306 may be configured to activate a selected memory string 304 during read and program operations. In some implementations, sources of the memory strings 304 in the same memory block 303 may be coupled through a Common Source Line (CSL) 310. In other words, all the memory strings 304 in the same memory block 303 have Array Common Sources (ACS). According to some implementations, the top select transistor 306 of each memory string 304 is coupled to a respective Bit Line (BL) 311, and data may be read or written from the bit line 311 via an output bus (not shown). In some implementations, each memory string 304 is configured to be selected or unselected by applying a select voltage (e.g., a voltage above a threshold voltage of the top select transistor 306) or an unselect voltage (e.g., 0 V) to the respective top select transistor 306 via one or more Top Select Lines (TSL) 308 and/or by applying a select voltage (e.g., a voltage above a threshold voltage of the bottom select transistor 307) or an unselect voltage (e.g., 0

V) to the respective bottom select transistor 307 via one or more Bottom Select lines (BSL) 309.

As shown in FIG. 4, the memory strings 304 may be organized into a plurality of memory blocks 303, and each of the plurality of memory blocks 303 may have a common source line 310. In some implementations, each memory block 303 is a basic data unit for an erase operation, e.g., all of the memory cells 305 on the same memory block 303 are erased at the same time. In order to erase the memory cells 305 in the selected memory block, the common source lines 310 coupled to the selected memory block as well as unselected memory blocks that are in the same plane as the selected memory block may be biased with an erase voltage. It is to be understood that in some examples, the erase operation may be performed at a half memory block level, a quarter memory block level, or a level having any suitable number of memory blocks or any suitable fractions of a memory block. The memory cells 305 of adjacent memory strings 304 may be coupled through word lines 312 that select which row of memory cells 305 is affected by the read and program operations.

Referring back to FIG. 4, the peripheral circuit 302 may be coupled to the memory array 301 through the bit lines 311, the word lines 312, the common source lines 310, the bottom select lines 309, and the top select lines 308. The peripheral circuit 302 may comprise any suitable analog, digital, and hybrid signal circuits for realizing the operations of the memory array 301 by applying and sensing voltage signals and/or current signals to and from each target memory cell 305 via the bit lines 311, the word lines 312, the common source lines 310, the bottom select lines 309, and the top select lines 308. The peripheral circuit 302 may comprise various types of peripheral circuits formed using a metal-oxide-semiconductor technology.

Figure 5:
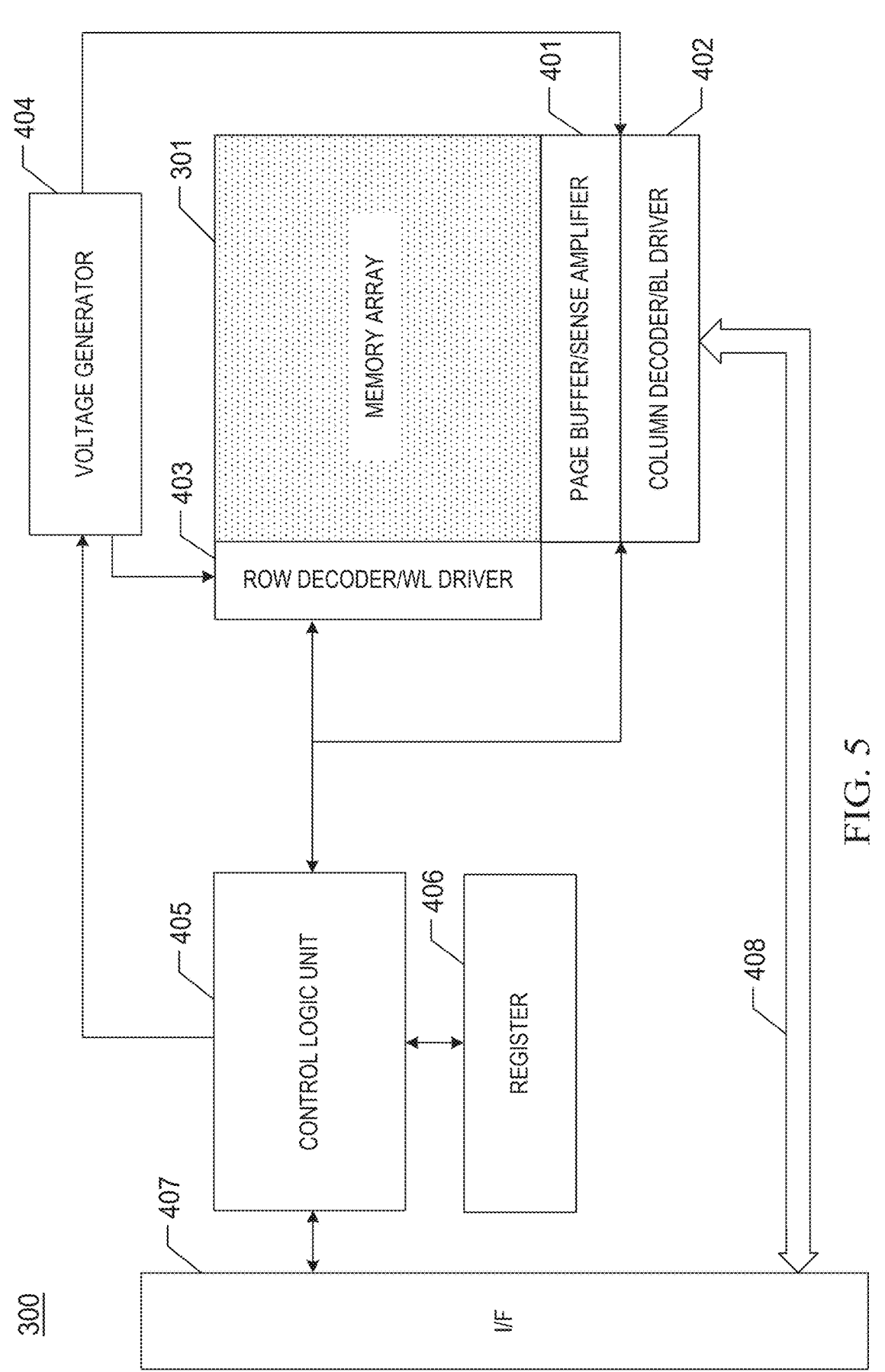
FIG. 5 is a schematic diagram of an example memory device comprising a memory array and a peripheral circuit provided by examples of the present disclosure.

FIG. 5 shows some example peripheral circuits. The peripheral circuit 302 comprises a page buffer/sense amplifier 401, a column decoder/bit line driver 402, a row decoder/word line driver 403, a voltage generator 404, a control logic 405, a register 406, a flash interface 407, and a data bus 408. It is to be understood that in some examples, additional peripheral circuits not shown in FIG. 5 may be comprised as well.

The page buffer/sense amplifier 401 may be configured to read and program (write) data from and to the memory array 301 according to a control signal from the control logic 405. In one example, the page buffer/sense amplifier 401 may store one page of program data (write data) to be programmed into the memory array 301. In another example, the page buffer/sense amplifier 401 may execute a program verification operation to ensure that the data has been properly programmed into the memory cell coupled to the selected word line. In yet another example, the page buffer/sense amplifier 401 may also sense a low power signal from the bit line that represents a data bit stored in the memory cell, and amplifies a small voltage swing to a recognizable logic level in the read operation. The column decoder/bit line driver 402 may be configured to be controlled by the control logic 405 and select one or more memory strings by applying a bit line voltage generated from the voltage generator 404.

The row decoder/word line driver 403 may be configured to be controlled by the control logic 405, select/unselect the memory blocks of the memory array 301, and select/unselect the word lines of the memory blocks. The row decoder/word line driver 403 may be further configured to drive the word lines using a word line voltage generated from the voltage generator 404. In some examples, the row decoder/ word line driver 403 may also select/unselect and drive the bottom select line and the top select line. As described below in detail, the row decoder/word line driver 403 is configured to execute the program operation on the memory cells that are coupled to (one or more) selected word line. The voltage generator 404 may be configured to be controlled by the control logic 405 and generate the word line voltage (such as, a read voltage, a program voltage, a pass voltage, a local voltage, a verify voltage, etc.), the bit line voltage, and a source line voltage to be supplied to the memory array 301.

The control logic 405 may be coupled to each peripheral circuit described above and configured to control the operation of each peripheral circuit. The register 406 may be coupled to the control logic 405 and comprise a state register, a command register, and an address register for storing state information, a command operation code (OP code), and a command address for controlling the operation of each peripheral circuit. The flash interface 407 may be coupled to the control logic 405, and act as a control buffer to buffer and relay a control command received from the host end apparatus (not shown) to the control logic 405 and the state information received from the control logic 405 to the memory controller. The flash interface 407 may also be coupled to the column decoder/bit line driver 402 via the data bus 408 and act as a data I/O interface and a data buffer to buffer and relay the data to and from the memory array 301.

As an electronic apparatus continues to operate at an ever-increasing speed, a data transmission speed of a memory device needs to be adaptively accelerated, e.g., more data need to be transmitted to the outside of the memory device within unit time. In this regard, the present disclosure provides the following implementations.

Figure 6:
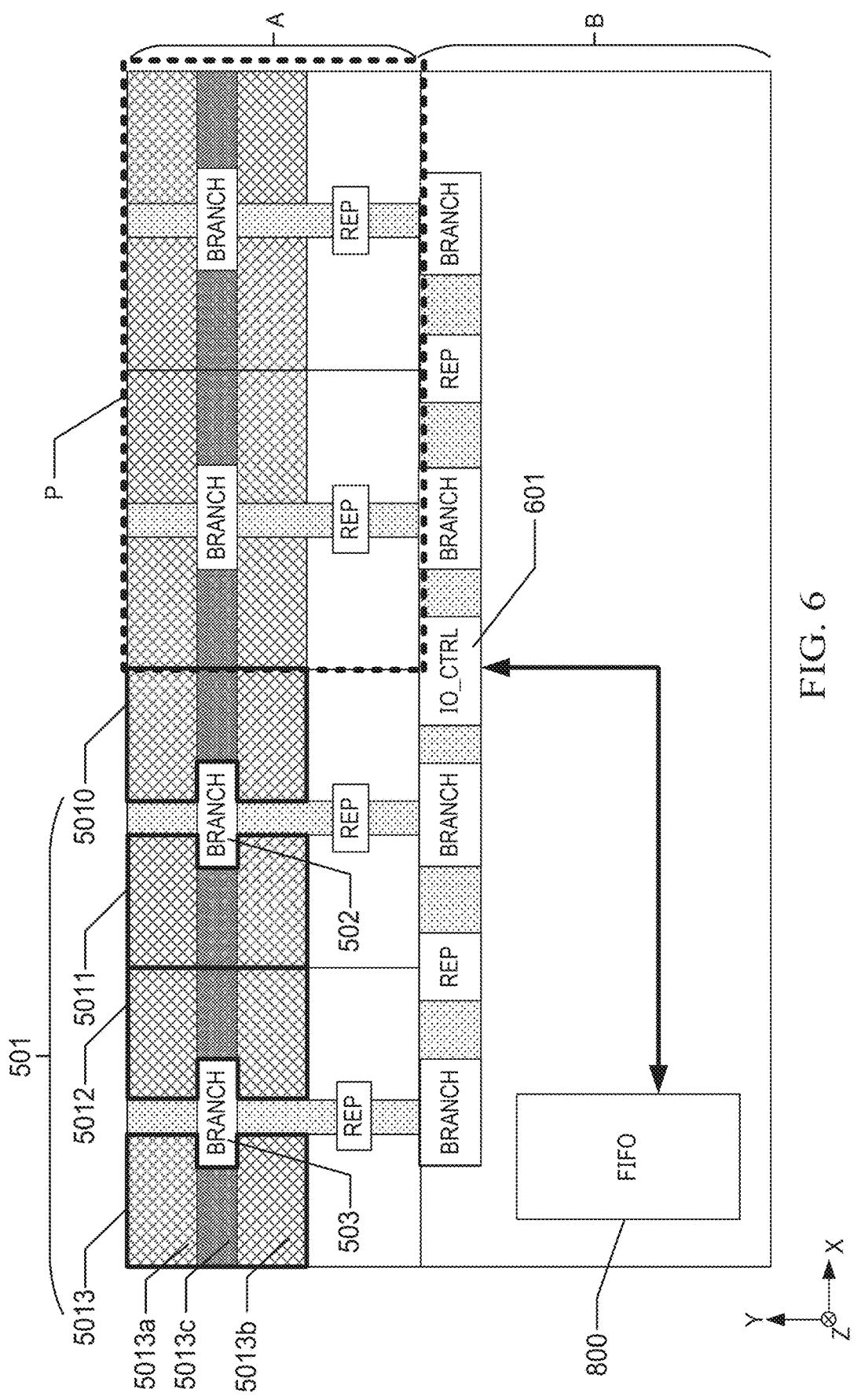
FIG. 6 is a schematic diagram I of a memory device provided by examples of the present disclosure.

The present disclosure provides a memory device. FIG. 6 is a schematic diagram of some of components of the memory device. The memory device comprises a memory plane area A and a pad area B, wherein the memory plane area A comprises a plurality of memory planes P. Herein, that the memory plane area A comprises two memory planes P is used as an example. The memory planes P may be independent of each other when a read operation, a program operation, or an erase operation is executed. For example, each memory plane P may be configured to independently execute the read operation in response to a read control signal received from the control logic 405.

In some examples, in order to enable the independent operation of each memory plane P, each memory plane P covers a local buffer for buffering read data and write data, and may process operations in parallel. In an example, each memory plane P may comprise a memory array and a group of peripheral circuits; the peripheral circuit may comprise a page buffer/sense amplifier, a column decoder/bit line driver, a row decoder/word line driver, etc., wherein the page buffer 501 is configured to temporarily store (buffer) one or more pages of data to be read from or write to the memory array.

It is to be noted that, in examples of the present disclosure, the schematic diagram of the memory device is a projection diagram of the memory device in a Z direction on an XY plane. The memory device may comprise a first semiconductor structure and a second semiconductor structure stacked in the Z direction; and a bonding interface may be comprised between the first semiconductor structure and the second semiconductor structure. The memory array is located in the first semiconductor structure, and structures shown in FIG. 6 are all located in the second semiconductor structure, e.g., the memory array in the memory plane P is located in the first semiconductor structure, the group of peripheral circuits in the memory plane P are located in the second semiconductor structure, and the memory array is covered by the peripheral circuits, such that the memory array is not shown in the figure, and a structure of the memory array may be described with reference to the above-mentioned examples with respect to FIG. 4.

In some examples, the page buffer 501 in one memory plane P may be divided into a plurality of partitions, and that the page buffer 501 comprises four partitions 5010, 5011, 5012, and 5013 is used as an example here. In some implementations, each partition may have the same size, e.g., each partition may be a quarter of the page buffer 501.

In some examples, the peripheral circuit further comprises a first branch node 502 and a second branch node 503, two partitions 5010 and 5011 of the page buffer 501 are symmetrically distributed on two opposite sides of the first branch node 502 in a second direction, and other two partitions 5012 and 5013 of the page buffer 501 are symmetrically distributed on two opposite sides of the second branch node 503 in the second direction. Herein, a first direction is perpendicular to the second direction. The first direction may be a Y direction, and the second direction may be an X direction.

In some examples, referring to FIG. 6, each partition of the page buffer 501 may comprise three portions. Using the partition 5013 as an example, the partition may comprise a first data storage portion 5013a, a second data storage portion 5013b, and a path setting portion 5013c, wherein the first data storage portion 5013a and the second data storage portion 5013b may comprise a plurality of latches, and are configured to buffer data; the path setting portion 5013c is a data path inside the partition 5013 and a setting area of a clock path; the first data storage portion 5013a and the second data storage portion 5013b may be connected with the second branch node 503 through the path setting portion 5013c; a data signal may be transmitted between the first data storage portion 5013a or the second data storage portion 5013b and the second branch node 503 via the data path in the path setting portion 5013c; and a clock signal may be transmitted between the first data storage portion 5013a or the second data storage portion 5013b and the second branch node 503 via the clock path in the path setting portion 5013c.

In the examples of the present disclosure, the memory plane area A and the pad area B both comprise path setting areas; the path setting areas are configured to set signal transmission paths such as the data path, the clock path, etc.; a path in the memory plane area A extends in the Y direction; the path setting area in the pad area B extends in the X direction; and the path setting area comprises a plurality of branch nodes (Branch) and a relay driver (REP), and is connected with an input/output node (IO_CTRL).

The pad area B further comprises a data temporary storage 800. The data buffered in the page buffer 501 may be transmitted to the input/output node 601 via the data path in the path setting area. Further, the data be transferred to the data temporary storage 800 from the input/output node 601.

Figure 7:
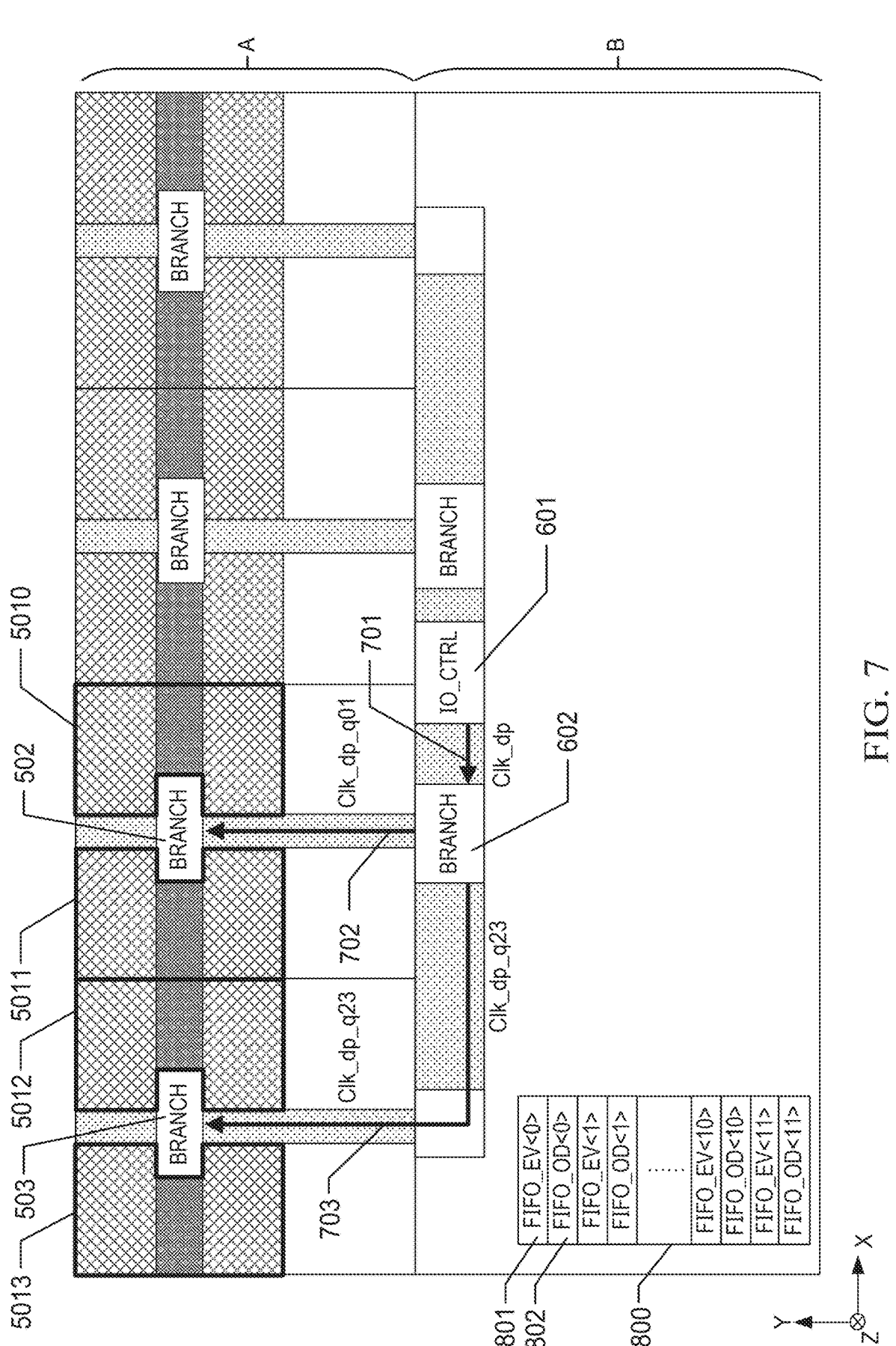
FIG. 7 is a schematic diagram II of a memory device provided by examples of the present disclosure.
Figure 8:
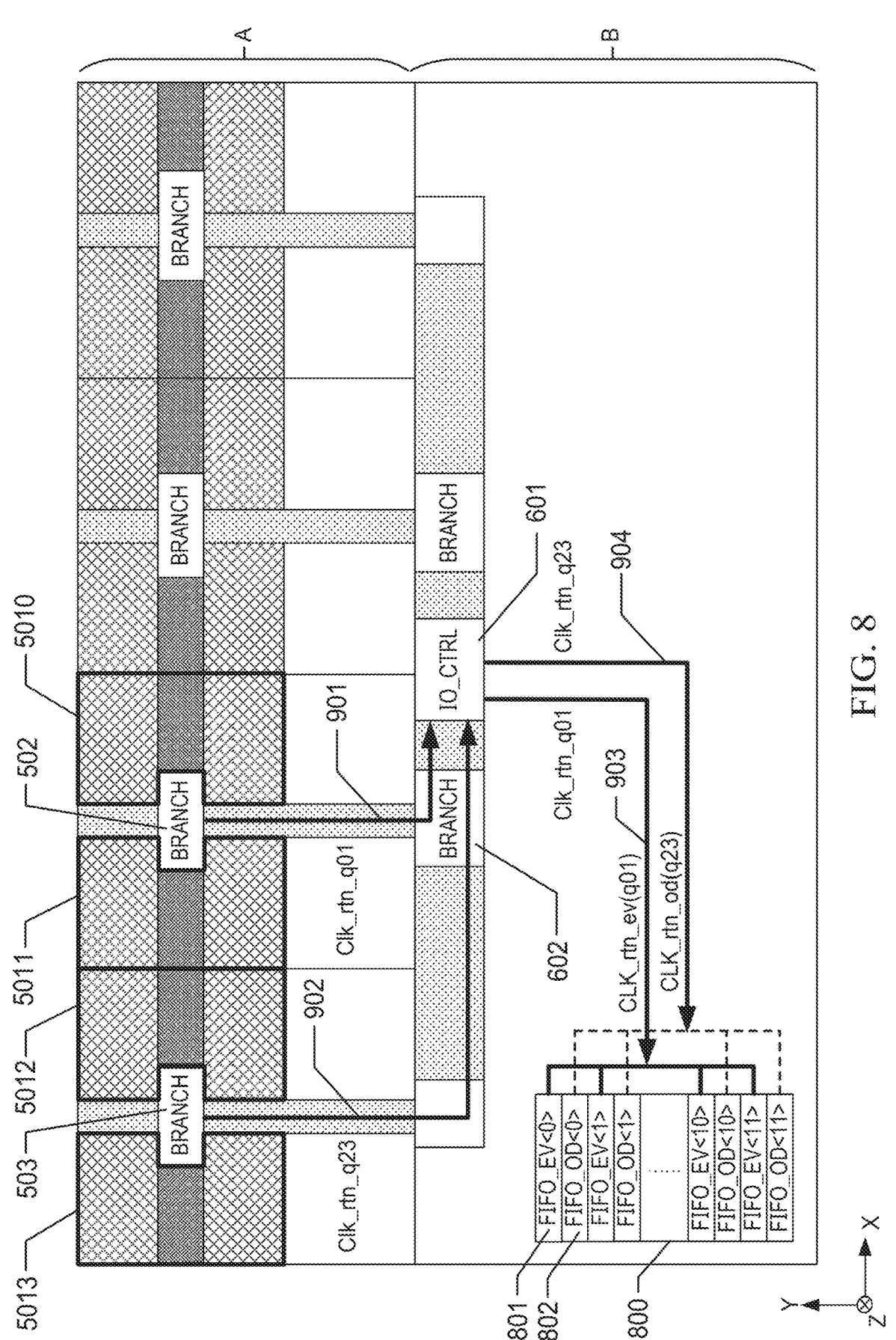
FIG. 8 is a schematic diagram III of a memory device provided by examples of the present disclosure.
Figure 9:
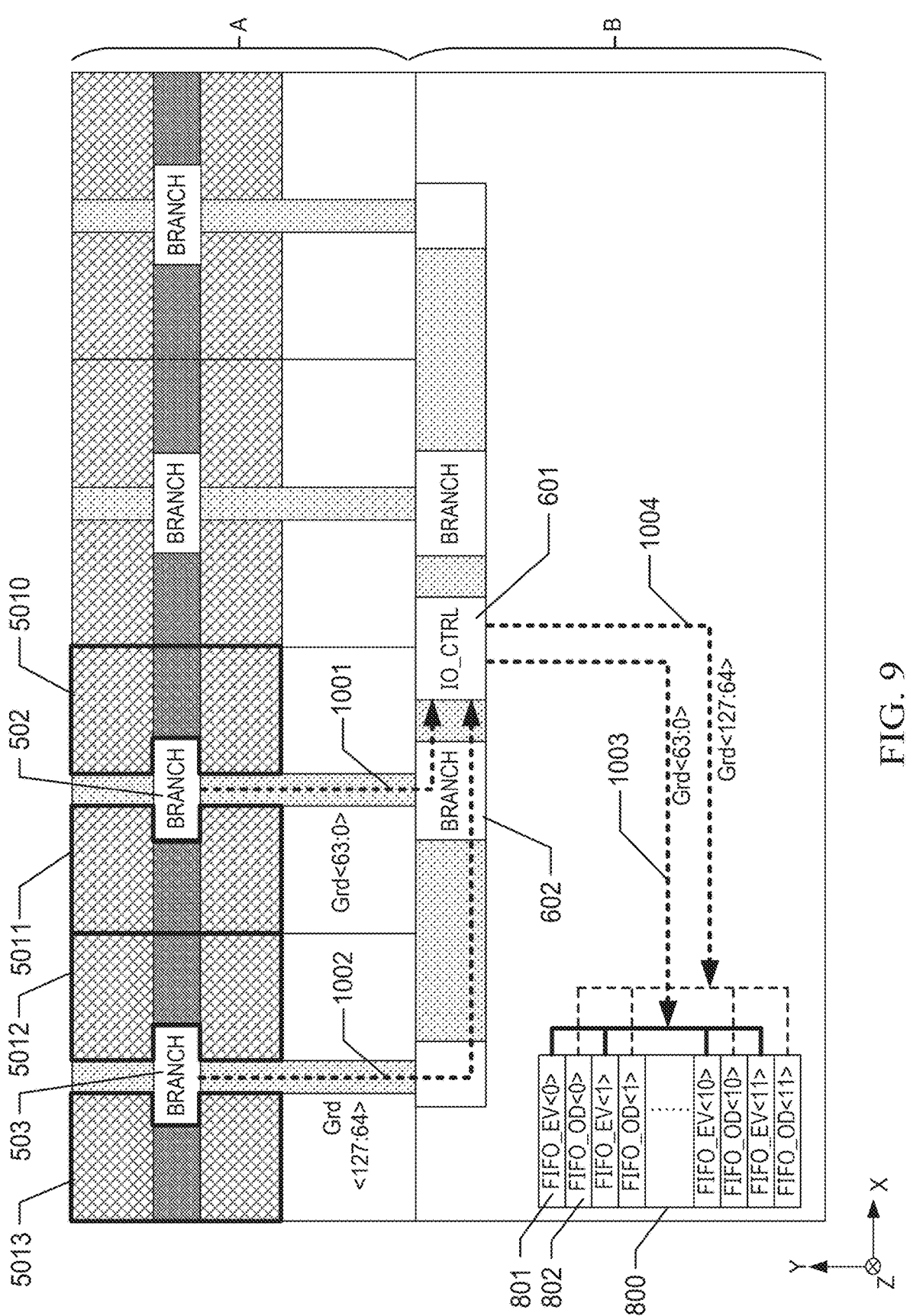
FIG. 9 is a schematic diagram IV of a memory device provided by examples of the present disclosure.
Figure 10:
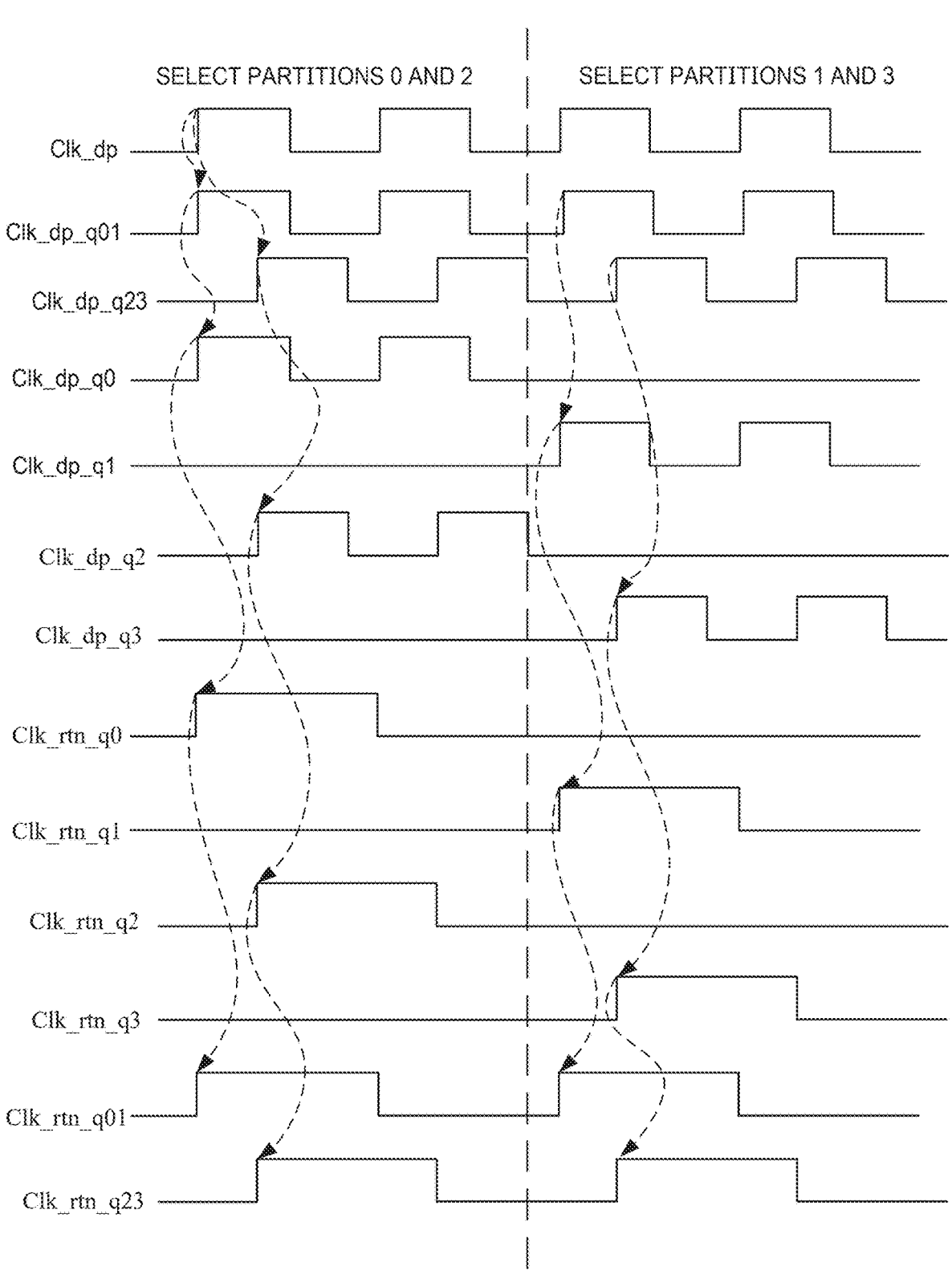
FIG. 10 is a timing diagram of data read from a page buffer provided by examples of the present disclosure.
Figure 11:
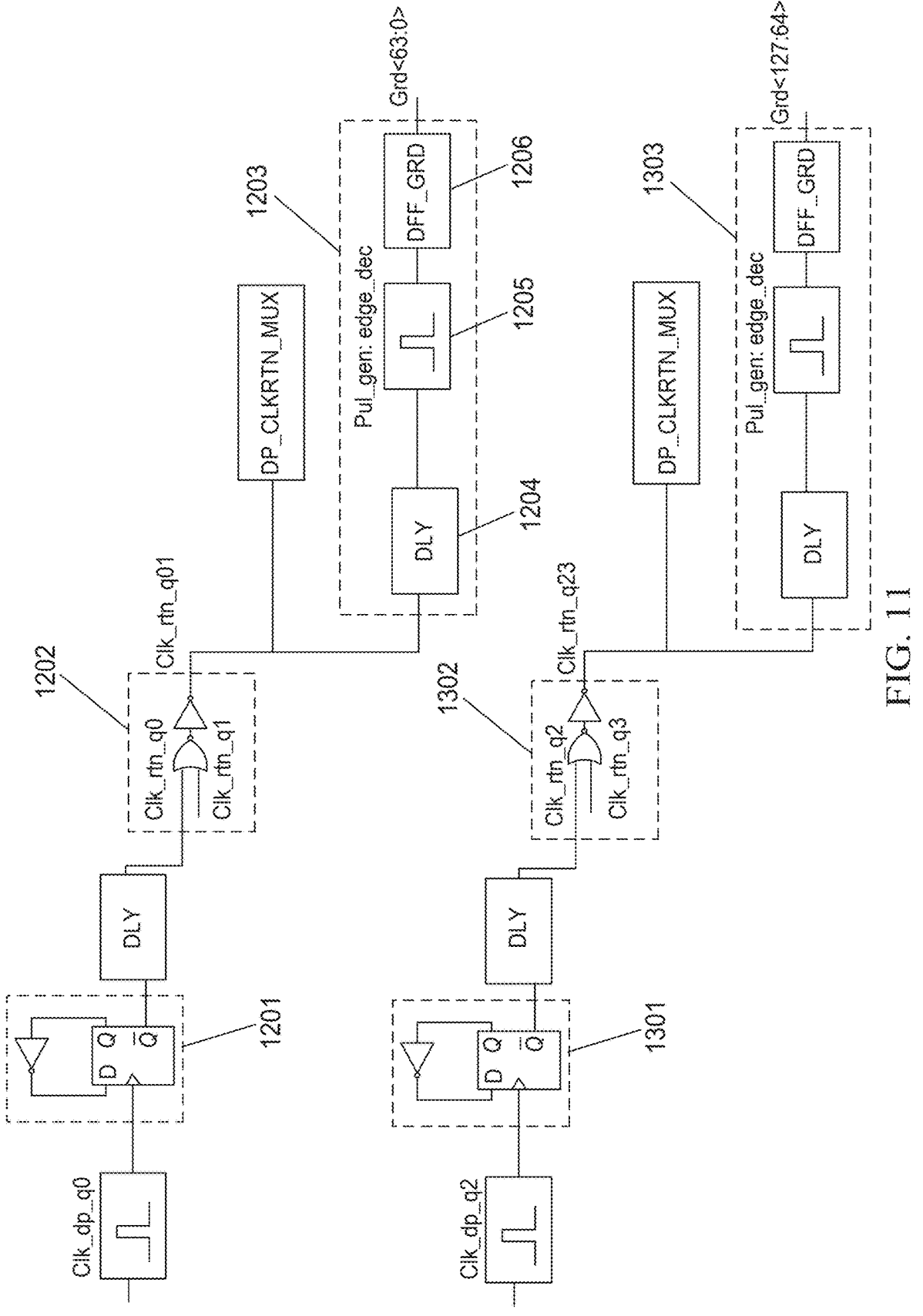
FIG. 11 is a circuit diagram of a clock path provided by examples of the present disclosure.
Figure 12:
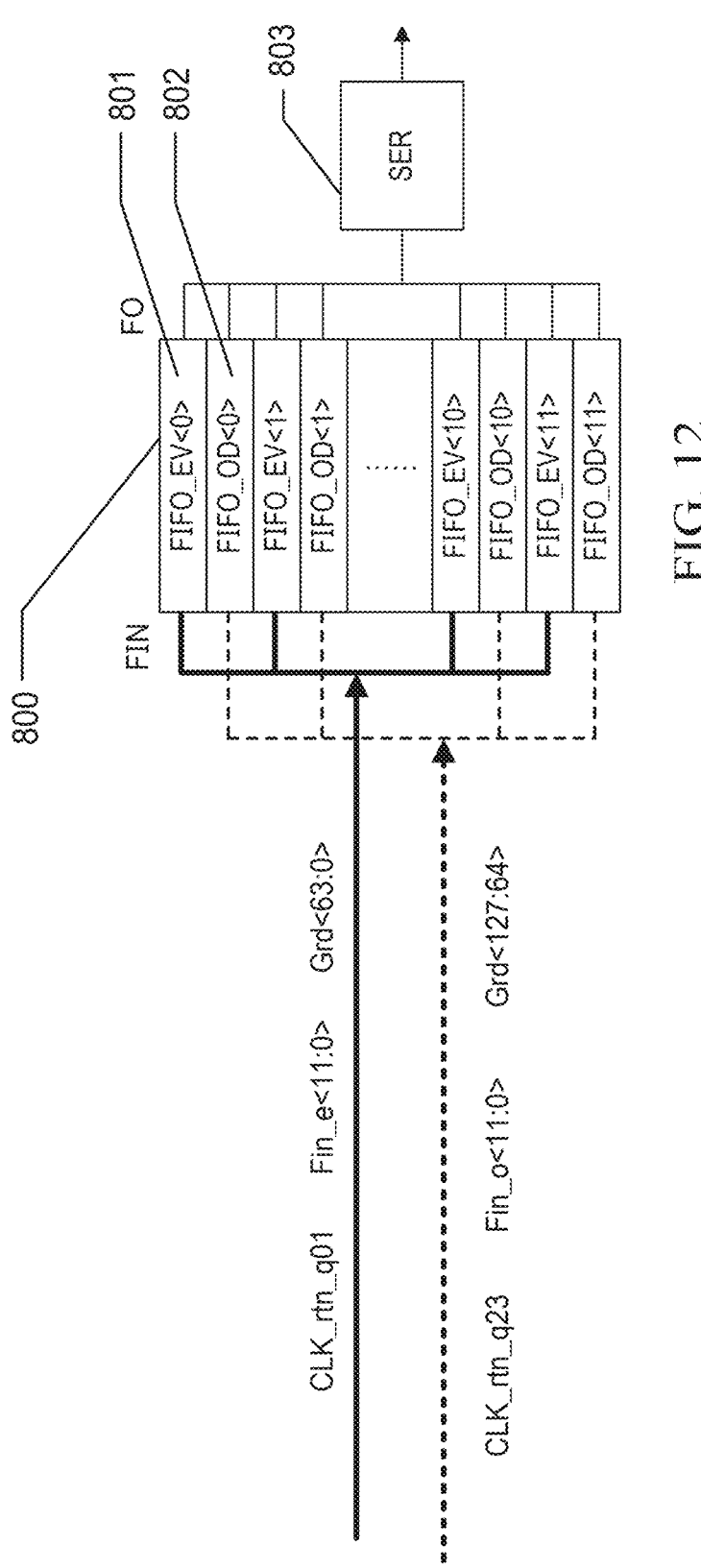
FIG. 12 is a schematic diagram of a data temporary storage provided by examples of the present disclosure.

FIGS. 7, 8, and 9 are schematic diagrams of the memory device provided by some examples, comprising setting modes of the data path and the clock path and transmission modes of the data signal and the clock signal when a read operation is performed. FIG. 10 is a timing diagram of data read from the page buffer provided by some examples; FIG. 11 is a circuit diagram of the clock path provided by some examples; and FIG. 12 is a schematic diagram of the data temporary storage provided by some examples. It is to be noted that, for the sake of brevity, some of components comprising the relay driver are omitted in FIGS. 7, 8, and 9.

In some examples, when the read operation is performed, data in the memory array may be buffered in at least one partition of the page buffer 501. In order to transfer the data from the page buffer 501 to the data temporary storage 800, the partition of the page buffer 501 may be configured to receive the clock signal, output a return clock signal based on the clock signal, and synchronously output the data signal.

In some examples, as shown in FIG. 7, the peripheral circuit comprises as a fifth clock path 701, a sixth clock path 702, and a seventh clock path 703, wherein two ends of the fifth clock path 701 are respectively connected with the input/output node 601 and a third branch node 602; two ends of the sixth clock path 702 are respectively connected with the third branch node 602 and the first branch node 502; and two ends of the seventh clock path 703 are respectively connected with the third branch node 602 and the second branch node 503.

In some examples, the input/output node 601 may receive a first clock signal Clk_dp; the fifth clock path 701 may be configured to transmit the first clock signal Clk_dp to the third branch node 602; the third branch node 602 may be configured to generate in parallel a first clock sub-signal Clk_dp_q01 and a second clock sub-signal Clk_dp_q23 based on the first clock signal Clk_dp; the sixth clock path 702 may be configured to transmit the first clock sub-signal Clk_dp_q01 to the first branch node 502; and the seventh clock path 703 may be configured to transmit the second clock sub-signal Clk_dp_q23 to the second branch node 503.

In the examples of the present disclosure, the sixth clock path 702 and the seventh clock path 703 have different lengths. In an example, as shown in FIG. 7, the length of the sixth clock path 702 is less than the length of the seventh clock path 703, such that the time for transmitting the first clock sub-signal Clk_dp_q01 to the first branch node 502 is slightly later than the time for transmitting the second clock sub-signal Clk_dp_q23 to the second branch node 503.

In some examples, the first branch node 502 may be configured to divide the first clock sub-signal Clk_dp_q01 into two clock signals Clk_dp_q0 and Clk_dp_q1, transmit the clock signal Clk_dp_q0 to the partition 5010, and transmit the clock signal Clk_dp_q1 to the partition 5011; and the second branch node 503 may be configured to divide the second clock sub-signal Clk_dp_q23 into two clock signals Clk_dp_q2 and Clk_dp_q3, transmit the clock signal Clk_dp_q2 to the partition 5012, and transmit the clock signal Clk_dp_q3 to the partition 5013.

In the examples of the present disclosure, referring to FIGS. 7 and 10 in combination, the third branch node 602 may generate in parallel the first clock sub-signal Clk_dp_q01 and the second clock sub-signal Clk_dp_q23 based on the first clock signal Clk_dp; within the same time range, the first branch node 502 may receive the first clock sub-signal Clk_dp_q01, and generate the clock signals Clk_dp_q0 and Clk_dp_q1; and the second branch node 503 may receive the second clock sub-signal Clk_dp_q23, and generate the clock signals Clk_dp_q2 and Clk_dp_q3. Therefore, the partition 5010 and the partition 5012 may respectively receive the clock signal Clk_dp_q0 and the clock signal Clk_dp_q2 within the same time range, e.g., the partition 5010 and the partition 5012 may be selected at the same time, and within a next time range, the partition 5011 and the partition 5013 may respectively receive the clock signal Clk_dp_q1 and the clock signal Clk_dp_q3, e.g., the partition 5011 and the partition 5013 may be selected at the same time.

In some examples, the partition 5010 may be configured to receive the clock signal Clk_dp_q0, and generate a return clock signal Clk_rtn_q0 based on the clock signal Clk_dp_q0; the partition 5011 may be configured to receive the clock signal Clk_dp_q1, and generate a return clock signal Clk_rtn_q1 based on the clock signal Clk_dp_q1; the partition 5012 may be configured to receive the clock signal Clk_dp_q2, and generate a return clock signal Clk_rtn_q2 based on the clock signal Clk_dp_q2; and the partition 5013 may be configured to receive the clock signal Clk_dp_q3, and generate a return clock signal Clk_rtn_q3 based on the clock signal Clk_dp_q3. As shown in FIG. 10, the return clock signal Clk_rtn_q0 and the return clock signal Clk_rtn_q2 may be generated within the same time range; and the return clock signal Clk_rtn_q1 and the return clock signal Clk_rtn_q3 may be generated within the same time range.

In some examples, the first branch node 502 may be configured to combine the return clock signal Clk_rtn_q0 outputted by the partition 5010 and the return clock signal Clk_rtn_q1 outputted by the partition 5011 to generate a first combined clock signal Clk_rtn_q01; and the second branch node 503 may be configured to combine the return clock signal Clk_rtn_q2 outputted by the partition 5012 and the return clock signal Clk_rtn_q3 outputted by the partition 5013 to generate a second combined clock signal Clk_rtn_q23.

In some examples, as shown in FIG. 8, the peripheral circuit comprises a first clock path 901 and a second clock path 902, wherein two ends of the first clock path 901 are respectively connected with the first branch node 502 and the input/output node 601; and two ends of the second clock path 902 are respectively connected with the second branch node 503 and the input/output node 601.

In some examples, the first clock path 901 may be configured to transmit the first combined clock signal Clk_rtn_q01 to the input/output node 601, and the second clock path 902 may be configured to transmit the second combined clock signal Clk_rtn_q23 to the input/output node 601.

In the examples of the present disclosure, the first clock path 901 and the second clock path 902 both pass through the third branch node 602; a portion of the first clock path 901 that is located between the third branch node 602 and the input/output node 601 is arranged parallel to a portion of the second clock path 902 that is located between the third branch node 602 and the input/output node 601, e.g., while the portion of the first clock path 901 that is located between the third branch node 602 and the input/output node 601 transmits the first combined clock signal Clk_rtn_q01 to the input/output node 601, the portion of the second clock path 902 that is located between the third branch node 602 and the input/output node 601 may transmit the second combined clock signal Clk_rtn_q23 to the input/output node 601.

It is to be noted that, in the examples of the present disclosure, parallel arrangement of the paths means that two independent paths are arranged in the same path setting area and extend in the same direction, and tail ends of the paths are connected with the same node; and parallel transmission of the signals means that two independent paths respectively transmit two independent signals within the same time range.

In some examples, referring to FIGS. 8 and 9 in combination, the partition also outputs the data signal while outputting the return clock signal. The first branch node 502 is further configured to combine the data signals outputted by the partition 5010 and the partition 5011 to generate a first combined data signal Grd<63:0>, and the second branch node 503 is further configured to combine the data signals outputted by the partition 5012 and the partition 5013 to generate a second combined data signal Grd<127:64>. The peripheral circuit further comprises a first data path 1001 and a second data path 1002, wherein the first data path 1001 is arranged parallel to the first clock path 901 and configured to transmit the first combined data signal Grd<63:0> to the input/output node 601 while the first clock path 901 transmits the first combined clock signal Clk_rtn_q01 to the input/output node 601; and the second data path 1002 is arranged parallel to the second clock path 902 and configured to transmit the second combined data signal Grd<127:64> to the input/output node 601 while the second clock path 902 transmits the second combined clock signal Clk_rtn_q23 to the input/output node 601.

It is to be noted that, in the examples of the present disclosure, for example, the read operation is to acquire read data from four partitions of the page buffer 501 at the same time, but the present disclosure is not limited thereto. In some other examples, the read data may only be acquired from one, two, or three partitions of the page buffer 501.

In the examples of the present disclosure, the first combined clock signal Clk_rtn_q01 and the second combined clock signal Clk_rtn_q23 may be transmitted to the input/output node 601 within the same time range, and the first combined data signal Grd<63:0> and the second combined data signal Grd<127:64> may also be transmitted to the input/output node 601 within the same time range. If bit widths of the first data path 1001 and the second data path 1002 both are 64 bits, a bit width of the data signal transmitted to the input/output node 601 may be 128 bits, such that a degree of parallelism of data transmission may be increased, e.g., more data may be transmitted from the page buffer 501 to the input/output node 601 within unit time.

In some examples, FIG. 11 is a circuit diagram of the clock path and branch nodes of the memory device shown in FIG. 8. Referring to FIGS. 8, 10, and 11 in combination, each partition of the page buffer 501 comprises a frequency divider, and the frequency divider may be configured to receive the clock signal and generate the return clock signal based on the clock signal. Using the frequency divider 1201 of the partition 5010 as an example, the frequency divider 1201 may receive the clock signal Clk_dp_q0, and generate the return clock signal Clk_rtn_q0 based on the clock signal Clk_dp_q0. In an example, the frequency divider 1201 comprises a flip-flop, wherein the flip-flop may be a D flip-flop (DFF), a clock input of the DFF may receive the clock signal Clk_dp_q0, and a Q output of the DFF may be coupled to a D input via a phase inverter, and a Q output of the DFF may output the return clock signal Clk_rtn_q0. Referring to FIGS. 10 and 11 in combination, the frequency divider 1201 of the partition 5010 may double a period of the clock signal Clk_dp_q0, so as to output the return clock signal Clk_rtn_q0. Similarly, the frequency divider 1301 of the partition 5012 may double a period of the clock signal Clk_dp_q2, so as to output the return clock signal Clk_rtn_q2. It is to be noted that, the frequency dividers of the partition 5011 and the partition 5013 are omitted in FIG. 11. However, it can be understood that, each partition comprises the frequency divider that may generate the return clock signal based on the clock signal.

In some examples, referring to FIGS. 8, 10, and 11 in combination, the first branch node 502 and the second branch node 503 both comprise an OR gate. In an example, an OR gate 1202 of the first branch node 502 is configured to combine the return clock signal Clk_rtn_q0 outputted by the partition 5010 and the return clock signal Clk_rtn_q1 outputted by the partition 5011 to generate the first combined clock signal Clk_rtn_q01; and an OR gate 1302 of the second branch node 503 is configured to combine the return clock signal Clk_rtn_q2 outputted by the partition 5012 and the return clock signal Clk_rtn_q3 outputted by the partition 5013 to generate the second combined clock signal Clk_rtn_q23.

In some examples, referring to FIGS. 8 and 11 in combination, the input/output node 601 comprises: a first match circuit 1203 configured to match the first combined clock signal Clk_rtn_q01 and the first combined data signal Grd<63:0>; and a second match circuit 1303 configured to match the second combined clock signal Clk_rtn_q23 and the second combined data signal Grd<127:64>. In an example, using the first match circuit 1203 as an example, the first match circuit 1203 may comprise a delay circuit 1204, a pulse generator 1205, and a D flip-flop 1206, wherein the delay circuit 1204 may delay the first combined clock signal Clk_rtn_q01 to obtain a synchronized first combined clock signal Clk_rtn_q01, and the pulse generator 1205 may generate a clock input of the D flip-flop 1206 based on an edge detection result of the first combined clock signal Clk_rtn_q01 and at the same time use the first combined data signal Grd<63:0> as a data input of the D flip-flop 1206, such that a synchronized first combined data signal Grd<63:0> may be outputted.

In some examples, referring to FIGS. 8 and 9, the peripheral circuit further comprises the data temporary storage 800, a third clock path 903, a fourth clock path 904, a third data path 1003, and a fourth data path 1004, wherein two ends of the third clock path 903, the fourth clock path 904, the third data path 1003, and the fourth data path 1004 are respectively connected with the input/output node 601 and the data temporary storage 800.

In the examples of the present disclosure, the input/output node 601 may be configured to output a first combined clock signal Clk_rtn_q01 and a first combined data signal Grd<63:0> that are synchronized, transmit the first combined clock signal Clk_rtn_q01 and the first combined data signal Grd<63:0> to the data temporary storage 800 via the third clock path 903 and the third data path 1003 respectively, output a second combined clock signal Clk_rtn_q23 and a second combined data signal Grd<127:64> within the same time range that are synchronized, and transmit the second combined clock signal Clk_rtn_q23 and the second combined data signal Grd<127:64> to the data temporary storage 800 via the fourth clock path 904 and the fourth data path 1004 respectively.

In some examples, the data temporary storage 800 comprises a plurality of first temporary storage areas (FIFO_EV) 801 and a plurality of second temporary storage areas (FIFO_OD) 802, and the first temporary storage areas 801 and the second temporary storage areas 802 are alternately arranged. The plurality of first temporary storage areas 801 are configured to receive a first control signal and the first combined clock signal Clk_rtn_q01, and receive the first combined data signal Grd<63:0> based on the first control signal and the first combined clock signal Clk_rtn_q01; and the plurality of second temporary storage areas 802 are configured to receive a second control signal and the second combined clock signal Clk_rtn_q23, and receive the second combined data signal Grd<127:64> based on the second control signal and the second combined clock signal Clk_rtn_q23.

In some examples, as shown in FIG. 12, in response to the first control signal Fin_e<11:0>, the first combined data signal Grd<63:0> may be written to the plurality of first temporary storage areas 801, and in this process, the first combined clock signal Clk_rtn_q01 may be used as a write clock signal; and in response to the second control signal Fin_o<11:0>, the second combined data signal Grd<127: 64> may be written to the plurality of second temporary storage areas 802, and in this process, the second combined clock signal Clk_rtn_q23 may be used as a write clock signal.

It is to be noted that, in the examples of the present disclosure, that the data temporary storage 800 comprises 11 first temporary storage areas 801 and 11 second temporary storage areas 802 is used as an example, but the present disclosure is not limited thereto. In some other examples, the number of the first temporary storage areas 801 and the second temporary storage areas 802 may be more than 11, the number of the first temporary storage areas 801 may be different from the number of the second temporary storage areas 802, and the present disclosure is not limited thereto.

In some examples, continuously referring to FIG. 12, after the first combined data signal Grd<63:0> and the second combined data signal Grd<127:64> are written to the data temporary storage 800, in response to an output control signal and an output clock signal, the data signal may be outputted from the data temporary storage 800, and transmitted to the outside of the memory device in a serial form via a parallel to serial circuit (SER) 803, so as to complete the read operation.

In some examples, the data temporary storage 800 is a first-in-first-out memory (FIFO). When the data signal is outputted from the data temporary storage 800, data output may be performed in a mode of alternately outputting data in one first temporary storage area 801 and data in one second temporary storage area 802, e.g., according to a sequence of FIFO_EV<0>, FIFO_OD<0>, FIFO_EV<1>, FIFO_OD<1>, . . . , FIFO_EV<10>, FIFO_OD<10>, FIFO_EV<11>, and FIFO_OD<11>.

In the examples of the present disclosure, the first combined clock signal Clk_rtn_q01 and the second combined clock signal Clk_rtn_q23 may be used as the write clock signals of the data temporary storage 800, and data being written in the first temporary storage area 801 and data being written in the second temporary storage area 802 are independent of each other, such that after the first combined data signal Grd<63:0> is transmitted to the data temporary storage 800, the first combined data signal may be written to the first temporary storage area 801 without waiting for the second combined data signal Grd<127:64>, thereby improving transmission efficiency of the data. Furthermore, an appropriate time window may be provided for the writing of data to the data temporary storage 800, reduction in the reliability of data transmission due to differences in data write speeds caused by differences in the formation process of different temporary storage areas is avoided. In addition, the output clock signal and the write clock signal of the data temporary storage 800 are also independent of each other, such that even if the first combined clock signal Clk_rtn_q01 and the second combined clock signal Clk_rtn_q23 are not synchronized, a timing sequence of outputting the data signals from the data temporary storage 800 is not affected.

In the examples of the present disclosure, when read data is acquired from the page buffer 501, the first combined clock signal Clk_rtn_q01 and the first combined data signal Grd<63:0>, and the second combined clock signal Clk_rtn_q23 and the second combined data signal Grd<127: 64> may be transmitted in parallel to the input/output node 601, and transmitted to the data temporary storage 800 from the input/output node 601. In one aspect, the first combined clock signal Clk_rtn_q01 and the second combined clock signal Clk_rtn_q23 do not need to be combined, and the first combined data signal Grd<63:0> and the second combined data signal Grd<127:64> do not need to be combined as well, such that a matching cost caused by a difference between a length of a path between the first branch node 502 and the third branch node 602 and a length of a path between the second branch node 503 and the third branch node 602 may be saved, so as to improve efficiency of data transmission. In the other aspect, between the third branch node 602 and the input/output node 601, the bit width of the data signal is twice the bit width of the data path located in the memory plane area A, and between the input/output node 601 and the data temporary storage 800, the bit width of the data signal is also twice the bit width of the data path located in the memory plane area A, that is, a degree of parallelism of data transmission may be increased without changing the bit width of the data path in the memory plane area A, so as to transmit more data to the data temporary storage 800 within unit time, such that transmission efficiency of the read data in the memory device may be improved to make the memory device meet requirements of an electronic apparatus with a higher processing speed.

Figure 13:
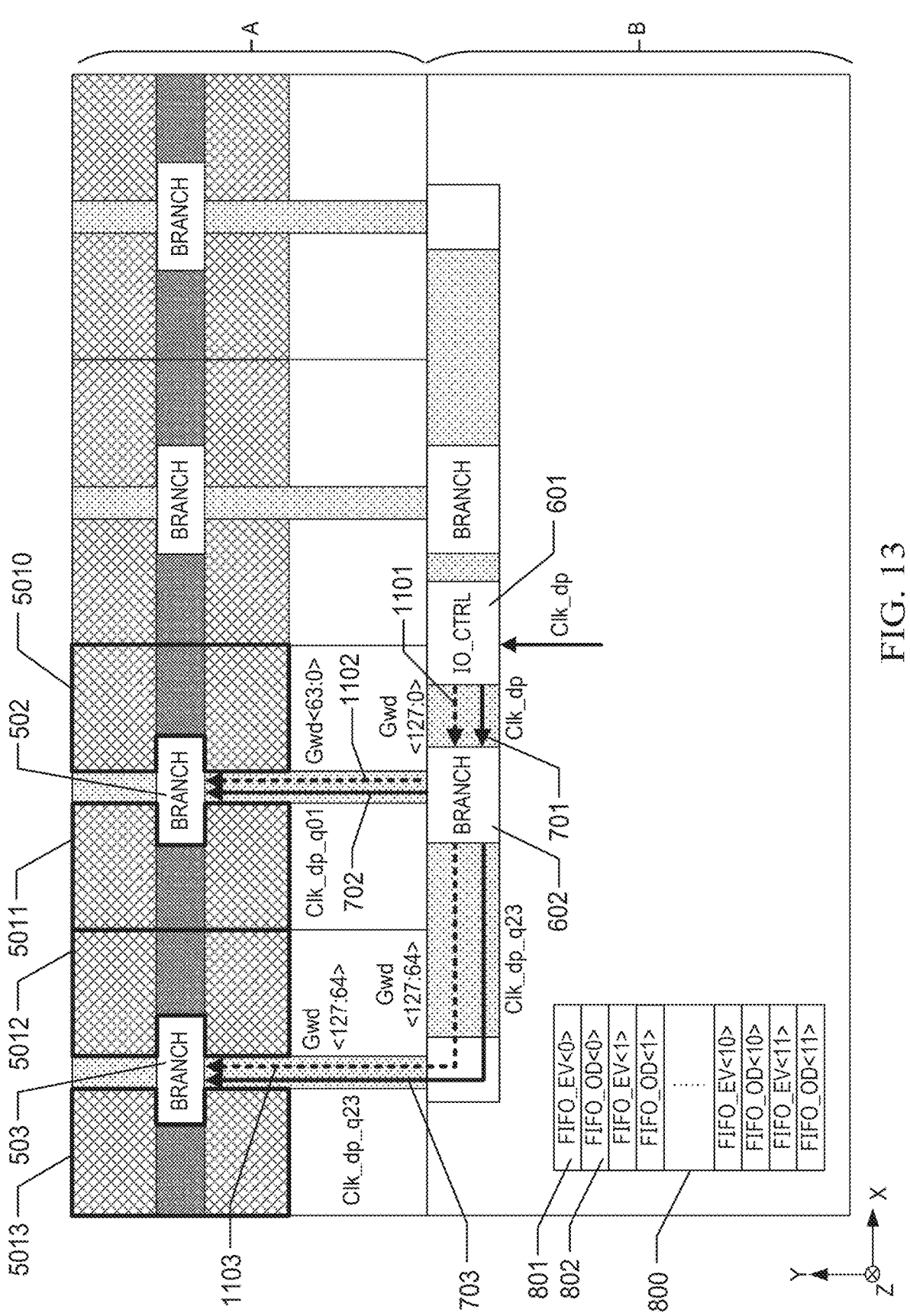
FIG. 13 is a schematic diagram V of a memory device provided by examples of the present disclosure.

In some examples, as shown in FIG. 13, the peripheral circuit further comprises a fifth data path 1101 arranged parallel to the fifth clock path 701, a sixth data path 1102 arranged parallel to the sixth clock path 702, and a seventh data path 1103 arranged parallel to the seventh clock path 703.

In the examples of the present disclosure, when a write operation is performed, data to be written to the memory array may be first transmitted to the partition of the page buffer 501 for temporary storage from the input/output node 601. In an example, the fifth data path 1101 may be configured to transmit a first data signal Gwd<127:0> from the input/output node 601 to the third branch node 602; the third branch node 602 may be configured to equally divide the first data signal Gwd<127:0> into a first data sub-signal Gwd<63:0> and a second data sub-signal Gwd<127:64>; the sixth data path 1102 may be configured to transmit the first data sub-signal Gwd<63:0> from the third branch node 602 to the first branch node 502; and the seventh data path 1103 may be configured to transmit the second data sub-signal Gwd<127:64> from the third branch node 602 to the second branch node 503. Further, the first branch node 502 may be configured to divide the first data sub-signal Gwd<63:0> into two data signals Gwd<31:0> and Gwd<63: 32>, transmit the data signal Gwd<31:0> to the partition 5010, and transmit the data signal Gwd<63:32> to the partition 5011; and the second branch node 503 may be configured to divide the second data sub-signal Gwd<127: 64> into two data signals Gwd<95:64> and Gwd<127:96>, transmit the data signal Gwd<95:64> to the partition 5012, and transmit the data signal Gwd<127:96> to the partition 5013. In this process, the clock signal Clk_dp_q0 is transmitted to the partition 5010, and may be used as a write clock signal of the data signal Gwd<31:0>; the clock signal Clk_dp_q1 is transmitted to the partition 5011, and may be used as a write clock signal of the data signal Gwd<63:32>; the clock signal Clk_dp_q2 is transmitted to the partition 5012, and may be used as a write clock signal of the data signal Gwd<95:64>; and the clock signal Clk_dp_q3 is transmitted to the partition 5013, and may be used as a write clock signal of the data signal Gwd<127:96>.

In some examples, a bit width of the fifth data path 1101 is greater than or equal to twice the bit width of the sixth data path 1102 or twice the bit width of the seventh data path 1103. The third branch node 602 may output the first data sub-signal Gwd<63:0> and the second data sub-signal Gwd<127:64> within the same time range. Therefore, a degree of parallelism of data transmission may be increased without changing the bit width of the data path in the memory plane area A, and more data may be transmitted from the input/output node 601 to the page buffer 501 within unit time, such that transmission efficiency of write data in the memory device may be improved, so as to make the memory device meet requirements of an electronic apparatus with a higher processing speed.

In some examples, the memory device in the above-mentioned examples may be a three-dimensional NAND memory, and the memory array may be a NAND memory array.

Based on similar conception to the above-mentioned memory device, the present disclosure further provides a memory system. The memory system comprises: at least one memory device in any one of the aforementioned examples; and a controller coupled with the at least one memory device and configured to control the memory device. Example compositions and functional implementations of the memory system may be referred to the preceding descriptions of FIGS. 1 to 5, which will not be repeated here for the sake of brevity.

Figure 14:
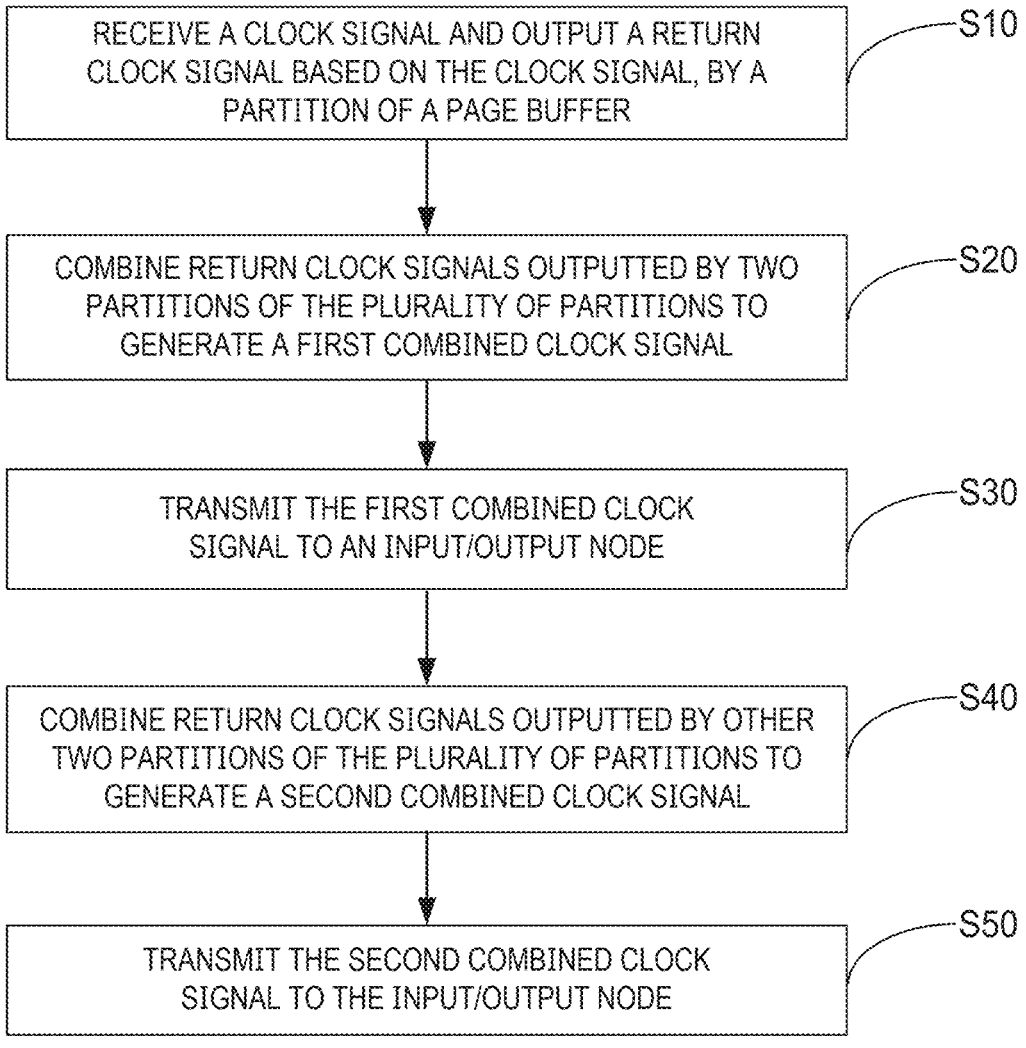
FIG. 14 is a flow diagram of an operation method of a memory device provided by examples of the present disclosure.

The present disclosure further provides an operation method of a memory device. FIG. 14 is a flow diagram of an operation method of a memory device provided by examples of the present disclosure. As shown in FIG. 14, the operation method of a memory device comprises:

operation S10: receiving a clock signal and outputting a return clock signal based on the clock signal, by a partition of a page buffer;

operation S20: combining return clock signals outputted by two partitions of a plurality of partitions to generate a first combined clock signal;

operation S30: transmitting the first combined clock signal to an input/output node;

operation S40: combining return clock signals outputted by other two partitions of the plurality of partitions to generate a second combined clock signal; and operation S50: transmitting the second combined clock signal to the input/output node.

In some examples, referring to FIGS. 7 and 10 in combination, before operation S10 is executed, the operation method of a memory device further comprises: receiving a first clock signal Clk_dp; transmitting the first clock signal Clk_dp from an input/output node 601 to a third branch node 602; generating in parallel a first clock sub-signal Clk_dp_q01 and a second clock sub-signal Clk_dp_q23 based on the first clock signal Clk_dp; transmitting the first clock sub-signal Clk_dp_q01 to a first branch node 502; and transmitting the second clock sub-signal Clk_dp_q23 to a second branch node 503.

In some examples, a process of executing operation S10 may comprise: receiving a clock signal Clk_dp_q0 and generating a return clock signal Clk_rtn_q0 based on the clock signal Clk_dp_q0, by a partition 5010; receiving a clock signal Clk_dp_q1 and generating a return clock signal Clk_rtn_q1 based on the clock signal Clk_dp_q1, by a partition 5011; receiving a clock signal Clk_dp_q2 and generating a return clock signal Clk_rtn_q2 based on the clock signal Clk_dp_q2, by a partition 5012; and receiving a clock signal Clk_dp_q3 and generating a return clock signal Clk_rtn_q3 based on the clock signal Clk_dp_q3, by a partition 5013. As shown in FIG. 10, the return clock signal Clk_rtn_q0 and the return clock signal Clk_rtn_q2 may be generated within the same time range; and the return clock signal Clk_rtn_q1 and the return clock signal Clk_rtn_q3 may be generated within the same time range.

It is to be noted that, the operations of the memory operation method in FIG. 14 are not sorted in a chronological order. In some examples, referring to FIGS. 8 and 10 in combination, operation S20 and operation S40 may be executed in parallel, and operation S30 and operation S50 may also be executed in parallel.

In some examples, processes of executing operation S20 and operation S40 may comprise: combining the return clock signal Clk_rtn_q0 outputted by the partition 5010 and the return clock signal Clk_rtn_q1 outputted by the partition 5011 to generate a first combined clock signal Clk_rtn_q01; and combining the return clock signal Clk_rtn_q2 outputted by the partition 5012 and the return clock signal Clk_rtn_q3 outputted by the partition 5013 to generate a second combined clock signal Clk_rtn_q23.

In some examples, processes of executing operation S30 and operation S50 may comprise: transmitting in parallel the first combined clock signal Clk_rtn_q01 and the second combined clock signal Clk_rtn_q23 to the input/output node 601.

In some examples, referring to FIG. 9, the operation method of a memory device further comprises: combining data signals outputted by the partition 5010 and the partition 5011 to generate a first combined data signal Grd<63:0>; combining data signals outputted by the partition 5012 and the partition 5013 to generate a second combined data signal Grd<127:64>; transmitting the first combined data signal Grd<63:0> to the input/output node 601; and transmitting the second combined data signal Grd<127:64> to the input/output node 601.

In some examples, the operation method of a memory device further comprises: matching the first combined clock signal Clk_rtn_q01 and the first combined data signal Grd<63:0>; and matching the second combined clock signal Clk_rtn_q23 and the second combined data signal Grd<127:64>.

In some examples, the operation method of a memory device further comprises: transmitting the first combined clock signal Clk_rtn_q01 and the first combined data signal Grd<63:0> from the input/output node 601 to a data temporary storage 800; and transmitting the second combined clock signal Clk_rtn_q23 and the second combined data signal Grd<127:64> from the input/output node 601 to the data temporary storage 800.

In some examples, referring to FIGS. 8, 9, and 12 in combination, the operation method of a memory device further comprises: receiving a first control signal Fin_e<11:0> and the first combined clock signal Clk_rtn_q01 by a plurality of first temporary storage areas 801 of the data temporary storage 800, and receiving the first combined data signal Grd<63:0> based on the first control signal Fin_e<11:0> and the first combined clock signal Clk_rtn_q01; and receiving a second control signal Fin_o<11:0> and the second combined clock signal Clk_rtn_q23 by a plurality of second temporary storage areas 802 of the data temporary storage 800, and receiving the second combined data signal Grd<127:64> based on the second control signal Fin_o<11: 0> and the second combined clock signal Clk_rtn_q23, wherein the first temporary storage areas 801 and the second temporary storage areas 802 are alternately arranged.

In some examples, referring to FIG. 13, the operation method of a memory device further comprises: receiving a first clock signal Clk_dp when a write operation is executed; transmitting the first clock signal Clk_dp from the input/ output node 601 to the third branch node 602; generating in parallel a first clock sub-signal Clk_dp_q01 and a second clock sub-signal Clk_dp_q23 based on the first clock signal Clk_dp; transmitting the first clock sub-signal Clk_dp_q01 to the first branch node 502; and transmitting the second clock sub-signal Clk_dp_q23 to the second branch node 503. While the first clock signal Clk_dp is received, a first data signal Gwd<127:0> is received; the first data signal Gwd<127:0> is transmitted from the input/output node 601 to the third branch node 602, and the first data signal Gwd<127:0> is equally divided into a first data sub-signal Gwd<63:0> and a second data sub-signal Gwd<127:64>; the first data sub-signal Gwd<63:0> is transmitted to the first branch node 502; and the second data sub-signal Gwd<127: 64> is transmitted to the second branch node 503.

In the examples of the present disclosure, when a read operation is executed, the first combined clock signal Clk_rtn_q01 and the first combined data signal Grd<63:0>, and the second combined clock signal Clk_rtn_q23 and the second combined data signal Grd<127:64> may be transmitted in parallel to the input/output node 601, and transmitted to the data temporary storage 800 from the input/ output node 601. The first combined clock signal Clk_rtn_q01 and the second combined clock signal Clk_rtn_q23 do not need to be combined, and the first combined data signal Grd<63:0> and the second combined data signal Grd<127:64> also do not need to be combined, such that a matching cost caused by a difference between a length of a path between the first branch node 502 and the third branch node 602 and a length of a path between the second branch node 503 and the third branch node 602 may be saved, so as to improve transmission efficiency of read data, so as to make the memory device meet requirements of an electronic apparatus with a higher processing speed. When the write operation is executed, the first data sub-signal Gwd<63:0> and the second data sub-signal Gwd<127:64> may be transmitted in parallel, and within unit time, more data may be transmitted from the input/ output node 601 to a page buffer 501, such that transmission efficiency of write data in the memory device may be improved, so as to make the memory device meet requirements of an electronic apparatus with a higher processing speed.

The characteristics disclosed in several device examples provided in the present disclosure may be combined arbitrarily without conflict to obtain a new device example.

The methods disclosed in several method implementations provided by the present disclosure can be combined arbitrarily without conflict to obtain a new method implementation.

The above is only the implementations of the present disclosure and not intended to limit the scope of protection of the present disclosure. Any variations or replacements apparent to those skilled in the art within the technical scope disclosed by the present disclosure shall fall within the scope of protection of the present disclosure.

What is claimed is:

1. A memory device, comprising:
a memory array; and
a peripheral circuit coupled with the memory array and comprising:
  a page buffer comprising a plurality of partitions, each of which configured to receive a clock signal and output a return clock signal based on the clock signal;
  a first branch node connected with two partitions of the plurality of partitions, and configured to combine return clock signals outputted by the two partitions to generate a first combined clock signal;
  a first clock path, wherein two ends of the first clock path are respectively connected with the first branch node and an input/output node, and the first clock path is configured to transmit the first combined clock signal to the input/output node;
  a second branch node connected with other two partitions of the plurality of partitions, and configured to combine return clock signals outputted by the other two partitions to generate a second combined clock signal; and
  a second clock path, wherein two ends of the second clock path are respectively connected with the second branch node and the input/output node, and the second clock path is configured to transmit the second combined clock signal to the input/output node.

2. The memory device of claim 1, wherein the peripheral circuit further comprises:
a third branch node, wherein the first clock path and the second clock path both pass through the third branch node,
wherein a portion of the first clock path that is located between the third branch node and the input/output node is arranged parallel to a portion of the second clock path that is located between the third branch node and the input/output node; the portion of the first clock path that is located between the third branch node and the input/output node is configured to transmit the first combined clock signal to the input/output node; and the portion of the second clock path that is located between the third branch node and the input/output node is configured to transmit the second combined clock signal to the input/output node.

3. The memory device of claim 1, wherein the first branch node is further configured to combine data signals outputted by the two partitions to generate a first combined data signal; the second branch node is further configured to combine data signals outputted by the other two partitions to generate a second combined data signal; and the peripheral circuit further comprises:
a first data path arranged parallel to the first clock path and configured to transmit the first combined data signal to the input/output node; and
a second data path arranged parallel to the second clock path and configured to transmit the second combined data signal to the input/output node.

4. The memory device of claim 3, wherein the input/ output node comprises:
a first match circuit configured to match the first combined clock signal and the first combined data signal; and a second match circuit configured to match the second combined clock signal and the second combined data signal.

5. The memory device of claim 4, wherein the peripheral circuit further comprises:

a data temporary storage;

a third clock path, wherein two ends of the third clock path are respectively connected with the input/output node and the data temporary storage, and the third clock path is configured to transmit the first combined clock signal to the data temporary storage;

a fourth clock path, wherein two ends of the fourth clock path are respectively connected with the input/output node and the data temporary storage, and the fourth clock path is configured to transmit the second combined clock signal to the data temporary storage;

a third data path, wherein two ends of the third data path are respectively connected with the input/output node and the data temporary storage, and the third data path is configured to transmit the first combined data signal to the data temporary storage; and a fourth data path, wherein two ends of the fourth data path are respectively connected with the input/output node and the data temporary storage, and the fourth data path is configured to transmit the second combined data signal to the data temporary storage.

6. The memory device of claim 5, wherein the data temporary storage comprises a plurality of first temporary storage areas and a plurality of second temporary storage areas; the first temporary storage areas and the second temporary storage areas are alternately arranged;

the plurality of first temporary storage areas are configured to receive a first control signal and the first combined clock signal, and receive the first combined data signal based on the first control signal and the first combined clock signal; and the plurality of second temporary storage areas are configured to receive a second control signal and the second combined clock signal, and receive the second combined data signal based on the second control signal and the second combined clock signal.

7. The memory device of claim 2, wherein the input/output node is configured to receive a first clock signal; and the peripheral circuit further comprises:

a fifth clock path, wherein two ends of the fifth clock path are respectively connected with the input/output node and the third branch node, and the fifth clock path is configured to transmit the first clock signal to the third branch node; the third branch node is configured to generate in parallel a first clock sub-signal and a second clock sub-signal based on the first clock signal;

a sixth clock path, wherein two ends of the sixth clock path are respectively connected with the third branch node and the first branch node, and the sixth clock path is configured to transmit the first clock sub-signal to the first branch node; and a seventh clock path, wherein two ends of the seventh clock path are respectively connected with the third branch node and the second branch node, and the seventh clock path is configured to transmit the second clock sub-signal to the second branch node; and a length of the sixth clock path is different from a length of the seventh clock path.

8. The memory device of claim 7, wherein the input/output node is configured to receive a first data signal; and the peripheral circuit further comprises:

a fifth data path arranged parallel to the fifth clock path, and configured to transmit the first data signal to the third branch node; the third branch node is further configured to equally divide the first data signal into a first data sub-signal and a second data sub-signal;

a sixth data path arranged parallel to the sixth clock path and configured to transmit the first data sub-signal to the first branch node; and a seventh data path, wherein two ends of the seventh data path are respectively connected with the third branch node and the second branch node, and the seventh data path is configured to transmit the second data sub-signal to the second branch node.

9. The memory device of claim 8, wherein a bit width of the fifth data path is greater than or equal to twice the bit width of the sixth data path or twice the bit width of the seventh data path.

10. The memory device of claim 2, comprising a pad area and a memory plane area arranged in a first direction, wherein the pad area comprises the input/output node and the third branch node;

the memory plane area comprises the page buffer, the first branch node, and the second branch node; the two partitions are symmetrically distributed on two opposite sides of the first branch node in a second direction; the other two partitions are symmetrically distributed on two opposite sides of the second branch node in the second direction; and the second direction is perpendicularly to the first direction.

11. The memory device of claim 1, wherein a partition comprises a frequency divider configured to receive the clock signal and generate the return clock signal based on the clock signal.

12. The memory device of claim 1, wherein the first branch node and the second branch node both comprise an OR gate; and an OR gate of the first branch node is configured to combine the return clock signals outputted by the two partitions to generate the first combined clock signal, and an OR gate of the second branch node is configured to combine the return clock signals outputted by the other two partitions to generate the second combined clock signal.

13. A memory system, comprising:

at least one memory device, comprising:

a memory array; and a peripheral circuit coupled with the memory array and comprising:

a page buffer comprising a plurality of partitions, each of which configured to receive a clock signal and output a return clock signal based on the clock signal;

a first branch node connected with two partitions of the plurality of partitions, and configured to combine return clock signals outputted by the two partitions to generate a first combined clock signal;

a first clock path, wherein two ends of the first clock path are respectively connected with the first branch node and an input/output node, and the first clock path is configured to transmit the first combined clock signal to the input/output node;

a second branch node connected with other two partitions of the plurality of partitions, and configured to combine return clock signals outputted by the other two partitions to generate a second combined clock signal; and

23 a second clock path, wherein two ends of the second clock path are respectively connected with the second branch node and the input/output node, and the second clock path is configured to transmit the second combined clock signal to the input/output node; and a memory controller coupled with the at least one memory device and configured to control the memory device.

14. A method of operating a memory device, comprising:

receiving a clock signal and outputting a return clock signal based on the clock signal, by a partition of a page buffer;

combining return clock signals outputted by two partitions of a plurality of partitions to generate a first combined clock signal;

transmitting the first combined clock signal to an input/output node;

combining return clock signals outputted by other two partitions of the plurality of partitions to generate a second combined clock signal; and transmitting the second combined clock signal to the input/output node.

15. The method of claim 14, wherein the transmitting the first combined clock signal to the input/output node, and the transmitting the second combined clock signal to the input/output node comprise:

transmitting in parallel the first combined clock signal and the second combined clock signal to the input/output node.

16. The method of claim 14, further comprising:

combining data signals outputted by the two partitions to generate a first combined data signal;

combining data signals outputted by the other two partitions to generate a second combined data signal;

transmitting the first combined data signal to the input/output node; and transmitting the second combined data signal to the input/output node.

17. The method of claim 16, further comprising:

matching the first combined clock signal and the first combined data signal; and matching the second combined clock signal and the second combined data signal.

18. The method of claim 17, further comprising:

transmitting the first combined clock signal and the first combined data signal to a data temporary storage from the input/output node; and transmitting the second combined clock signal and the second combined data signal to the data temporary storage from the input/output node.

19. The method of claim 18, further comprising:

receiving a first control signal and the first combined clock signal and receiving the first combined data signal based on the first control signal and the first combined clock signal, by a plurality of first temporary storage areas of the data temporary storage; and receiving a second control signal and the second combined clock signal and receiving the second combined data signal based on the second control signal and the second combined clock signal, by a plurality of second temporary storage areas of the data temporary storage, wherein the first temporary storage areas and the second temporary storage areas are alternately arranged.

20. The method of claim 15, wherein before receiving the clock signal by partitions of the page buffer and outputting the return clock signal based on the clock signal, the method further comprises:

receiving a first clock signal;

transmitting the first clock signal to a third branch node from the input/output node;

generating in parallel a first clock sub-signal and a second clock sub-signal based on the first clock signal;

transmitting the first clock sub-signal to a first branch node; and transmitting the second clock sub-signal to a second branch node.

* * * * *